United States Patent [19]
Dadashev

[11] Patent Number: 6,081,456
[45] Date of Patent: Jun. 27, 2000

[54] BIT LINE CONTROL CIRCUIT FOR A MEMORY ARRAY USING 2-BIT NON-VOLATILE MEMORY CELLS

[75] Inventor: Oleg Dadashev, Hadera, Israel

[73] Assignee: Tower Semiconductor Ltd., Migdal Haemek, Israel

[21] Appl. No.: 09/243,976

[22] Filed: Feb. 4, 1999

[51] Int. Cl.$^7$ .................................................. G11C 16/06
[52] U.S. Cl. .............................. 365/185.23; 365/230.04
[58] Field of Search ..................... 365/185.23, 185.29, 365/185.33, 230.02, 230.04, 218

[56] References Cited

U.S. PATENT DOCUMENTS

| | | | |
|---|---|---|---|
| 5,568,425 | 10/1996 | Song | 365/185.33 |
| 5,768,192 | 6/1998 | Eitan | 365/185.24 |

*Primary Examiner*—David Nelms
*Assistant Examiner*—David Lam
*Attorney, Agent, or Firm*—Bever, Hoffman & Harms, LLP; E. Eric Hoffman

[57] ABSTRACT

A bit line control circuit for accessing an array of 2-bit non-volatile memory cells. Each memory cell has a first and a second charge trapping regions. A set of bit lines extends between the array and the bit line control circuit. The bit line control circuit includes pass transistors that selectively route pairs of bit lines to corresponding voltage control circuits in either a first order or a second (reversed) order. This enables both the first and second charge trapping regions of the memory cells to be accessed from the same voltage control circuits. In one embodiment, the bit line control circuit includes a first-level pass transistor coupled to each bit line. A second set of bit lines is coupled to the first-level pass transistors. A parallel-connected pair of second-level pass transistors is coupled to each bit line in the second set of bit lines. A third set of bit lines is coupled to the second-level pass transistors. The voltage control circuits are coupled to the third set of bit lines. The voltage control circuits apply voltages to the third set of bit lines to perform read, write and erase operations in the memory cells of the memory array. The first and second level pass transistors provide a consistent path for accessing all memory cells in the array, as well as handling the edge conditions introduced by the right-most and left-most columns of memory cells.

18 Claims, 13 Drawing Sheets

BIT LINE CONTROL CIRCUIT FOR A MEMORY ARRAY USING 2-BIT NON-VOLATILE MEMORY CELLS

FIELD OF THE INVENTION

The present invention relates to a bit line control circuit for an array of memory cells. More specifically, the present invention relates to a method and structure of implementing a bit line control circuit for an electrically erasable programmable read only memory (EEPROM) array formed using 2-bit non-volatile memory cells.

RELATED ART

FIG. 1 is a cross sectional view of a conventional 1-bit non-volatile semiconductor memory cell 10 that utilizes asymmetrical charge trapping. 1-bit memory cell 10, which is fabricated in p-type substrate 12, includes n+ source region 14, n+ drain region 16, channel region 17, silicon oxide layer 18, silicon nitride layer 20, silicon oxide layer 22, and control gate 24. Oxide layer 18, nitride layer 20 and oxide layer 22 are collectively referred to as ONO layer 21. Memory cell 10 operates as follows. A programming operation is performed by connecting source region 14 to ground, connecting drain region 16 to a programming voltage of about 9 Volts, and connecting control gate 24 to a voltage of about 10 Volts. As a result, electrons are accelerated from source region 14 to drain region 16. Near drain region 16, some electrons gain sufficient energy to pass through oxide layer 18 and be trapped in nitride layer 20 in accordance with a phenomenon known as hot electron injection. Because nitride layer 20 is non-conductive, the injected charge remains localized within charge trapping region 26 in nitride layer 20.

Memory cell 10 is read by applying 0 Volts to the drain region 16, 2 Volts to the source region 14, and 3 volts to the gate electrode. If charge is stored in charge trapping region 26 (i.e., memory cell 10 is programmed), then memory cell does not conduct current under these conditions. If there is no charge stored in charge trapping region 26 (i.e., memory cell 10 is erased), then memory cell 10 conducts current under these conditions. The current, or lack of current, is sensed by a sense amplifier to determine the state of memory cell 10.

Note that the polarity of the voltage applied across source region 14 and drain region 16 is reversed during the program and read operations. That is, memory cell 10 is programmed in one direction (with source region 14 grounded), and read the opposite direction (with drain region 16 grounded). As a result, the read operation is referred to as a reverse read operation. Memory cell 10 is described in more detail in U.S. Pat. No. 5,768,192.

Memory cell 10 can also be controlled to operate as a 2-bit non-volatile semiconductor memory cell. To accomplish this, memory cell 10 is controlled to use a second charge trapping region in nitride layer 20, which is located adjacent to source region 14. FIG. 2 illustrates both the first charge trapping region 26 (described above in connection with FIG. 1), and the second charge trapping region 28 in dashed lines. The second charge trapping region 28 is used to store a charge representative of a second bit. The second charge trapping region 28 is programmed and read in a manner similar to the first charge trapping region 26. More specifically, the second charge trapping region 28 is programmed and read by exchanging the source and drain voltages described above for programming and reading the first charge trapping region 26. Thus, the second charge trapping region 28 is programmed by applying 0 Volts to drain region 16, applying 9 Volts to source region 14 and applying 10 Volts to control gate 24. Similarly, the second charge trapping region 28 is read by applying 0 Volts to source region 14, 2 Volts to drain region 16, and 3 Volts to control gate 24.

Note that because nitride layer 20 is non-conductive, the charges stored in the first and second charge trapping regions 26 and 28 remain localized within nitride layer 20. Also note that the state of the first charge trapping region 26 does not interfere with the reading of the charge stored in the second charge trapping region 28 (and vice versa). Thus, if the first charge trapping region 26 is programmed (i.e., stores charge) and the second charge trapping region 28 is not programmed (i.e., does not store charge), then a reverse read of the first charge trapping region will not result in significant current flow. However, a reverse read of the second bit will result in significant current flow because the high voltage applied to drain region 16 will result in unperturbed electronic transfer in the pinch off region adjacent to first charge trapping region 26. Thus, the information stored in the first and second charge trapping regions 26 and 28 is read properly.

Similarly, if both the first and second charge trapping regions are programmed, a read operation in either direction will result in no significant current flow. Finally, if neither the first charge trapping region 26 nor the second charge trapping region 28 is programmed, then read operations in both directions will result in significant current flow.

Because the 1-bit and 2-bit implementations of memory cell 10 are relatively new, the manner of using this memory cell 10 in a memory cell array has not yet been fully developed. It would therefore be desirable to have a memory array structure that allows memory cell 10 to be implemented as either a flash memory array or an electrically erasable programmable read only memory (EEPROM). For purposes of this disclosure, an EEPROM array is defined as a non-volatile memory array that can be erased on a word-by-word basis. This is in contrast to a flash memory array, which is defined as a non-volatile memory array that cannot be erased on a word-by-word basis, but which must be erased in blocks. It would further be desirable to have a bit line control circuit for use with a flash memory array or an EEPROM array that uses the 2-bit non-volatile memory cells described above.

SUMMARY

Accordingly, the present invention provides a bit line control circuit for accessing a memory cell array constructed from the above-described 2-bit non-volatile memory cells. As described above, each memory cell has a first charge trapping region for storing a first bit and a second charge trapping region for storing a second bit. A first set of bit lines extends between the memory cell array and the bit line control circuit. Select transistors within the memory cell array are controlled to couple the addressed memory cells to the first set of bit lines.

The bit line control circuit includes pass transistors that are controlled to selectively route a subset of the bit lines to corresponding voltage control circuits. Each of the voltage control circuits is selectively coupled to a pair of the bit lines. The pass transistors are controlled such that each pair of bit lines can be coupled to the voltage control circuits in either a first order or a second order, which is reversed from the first order.

For example, a voltage control circuit in accordance with one embodiment has a first terminal that can be selectively connected to ground or to a sense amplifier circuit, and a second terminal that can be coupled to receive a program voltage of 5.5 Volts, a read voltage of 2 Volts or an erase voltage of 8 volts. In this example, the pass transistors can be controlled to couple a first bit line to the first terminal and a second bit line to the second terminal (i.e., a first order). In addition, the pass transistors can be controlled to route the first bit line to the second terminal, and the second bit line to the first terminal (i.e., a second order). Reversing the order in which the voltage control circuit is connected to the bit lines enables both the first and second charge trapping regions of the addressed memory cell to be accessed using the same voltage control circuit.

In one embodiment, the bit line control circuit includes a plurality of first-level pass transistors. Each bit line is coupled to a corresponding one of the first-level pass transistors. As a result, the loading and delay through the first-level pass transistors is identical for all bit lines. The first-level pass transistors are further coupled to a second set of bit lines. There are fewer bit lines in the second set of bit lines than in the first set of bit lines. In one embodiment, there are $2^N+2$ bit lines in the first set of bit lines and $2^{N-2}+2$ bit lines in the second set of bit lines. If N is equal to eight, then there are 258 bit lines in the first set of bit lines, and 66 bit lines in the second set of bit lines. Within the first set of bit lines, 2 of the 258 bit lines are dedicated for handling the right-most and left-most columns of memory cells. Within the second set of bit lines, 2 of the 66 bit lines are dedicated for handling the right-most and left-most columns of memory cells.

The bit line control circuit further includes a plurality of second-level pass transistors. Each bit line in the second set of bit lines is coupled to a parallel-connected pair of the second-level pass transistors. As a result, the loading and delay through the second-level pass transistors is identical for all bit lines. The second-level pass transistors are further coupled to a third set of bit lines. In one embodiment, there are $2^{N-4}+4$ bit lines in the third set of bit lines. When N is equal to eight, there are 20 bit lines in the third set of bit lines. Within the third set of bit lines, four of the 20 bit lines are dedicated for handling the right-most and left-most columns of memory cells. The voltage control circuits are coupled to the third set of bit lines.

Each parallel-connected pair of second-level pass transistors can be controlled to reverse the connections between the voltage control circuits and the second set of bit lines. As a result, the voltage control circuits can be connected to the first set of bit lines in either a first order or a second order in the manner described above.

The present invention will be more fully understood in view of the following description and drawings.

DETAILED DESCRIPTION

Figure 1:
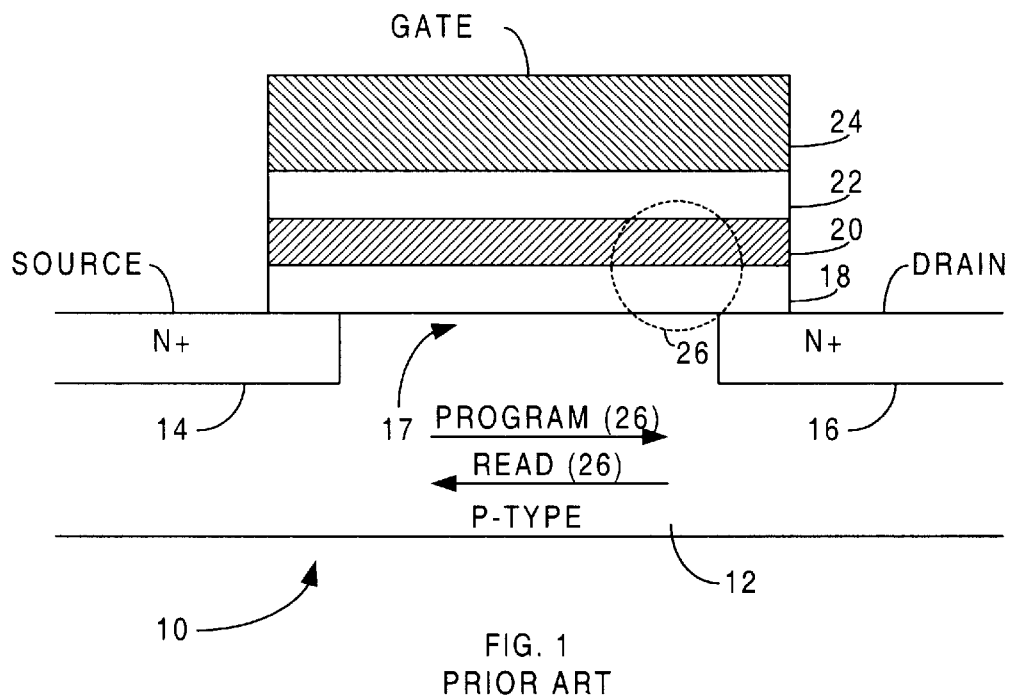
FIG. 1 is a cross sectional diagram illustrating a conventional 1-bit non-volatile memory cell.
Figure 2:
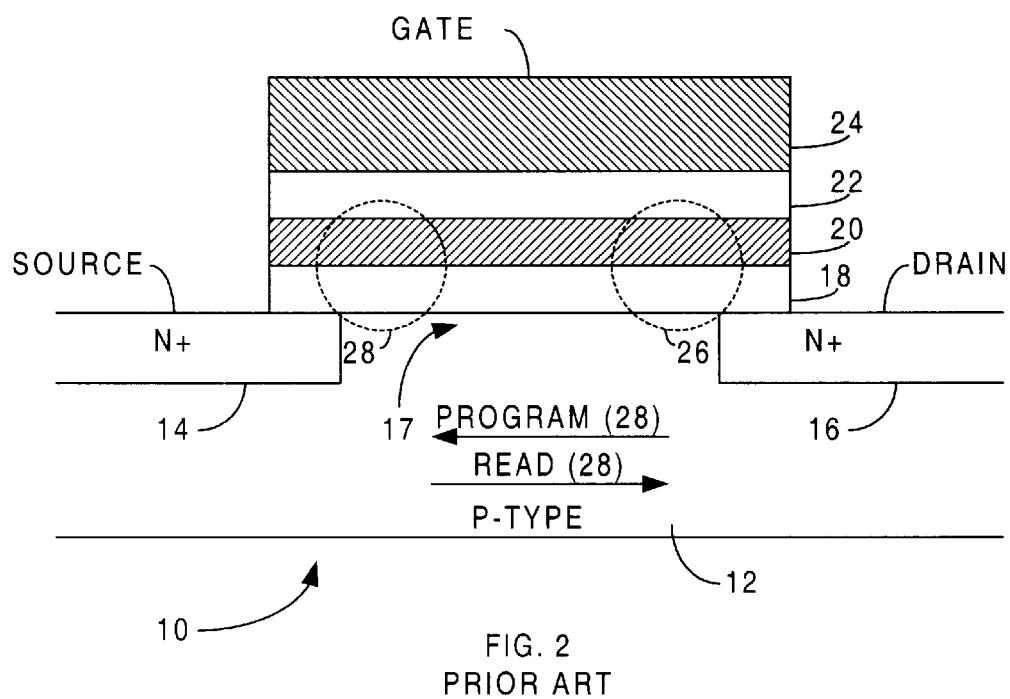
FIG. 2 is a cross sectional diagram illustrating a conventional 2-bit non-volatile memory cell.
Figure 3:
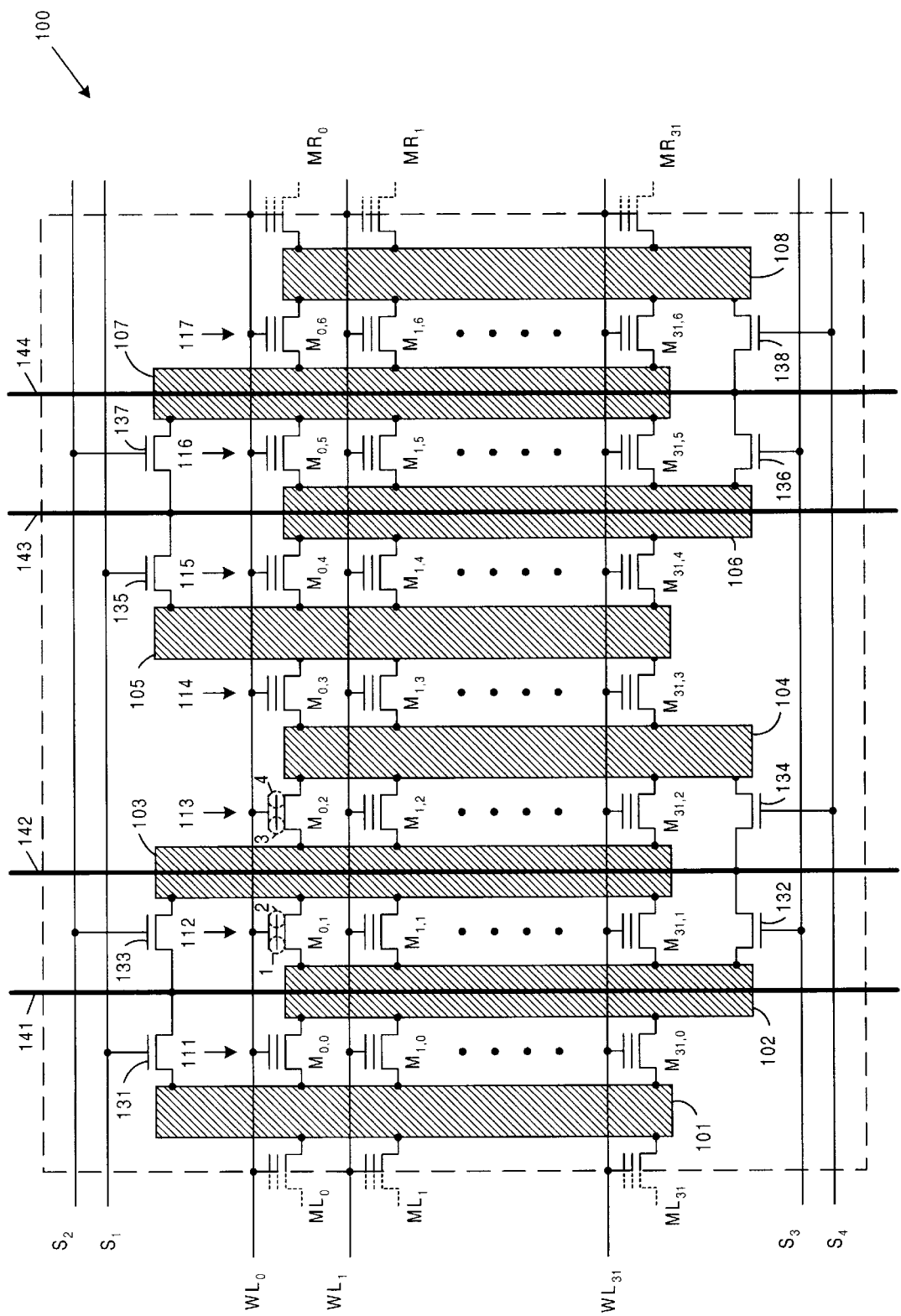
FIG. 3 is a schematic diagram illustrating a memory block that uses the 2-bit memory cells of FIG. 2.

FIG. 3 is a schematic diagram illustrating a memory block 100 in accordance with one embodiment of the present invention. Memory block 100 uses a plurality of 2-bit memory cells identical to 2-bit memory cell 10 (FIG. 2). Memory block 100 includes seven full columns of memory cells, two columns of memory cells that are shared with adjacent memory blocks, and thirty-two rows of memory cells. The rows extend along a first axis, and the columns extend along a second axis, perpendicular to the first axis. The memory cells in the seven full columns are identified as memory cells $M_{X,Y}$, where X and Y represent the row and column locations, respectively, of the memory cells within memory block 100. The shared memory cells on the left border of memory block 100 are identified as memory cells $ML_X$, and the shared memory cells on the right border of memory block 100 are identified as memory cells $MR_X$. Thus, memory block 100 includes memory cells $M_{0,0}$–$M_{31,6}$ and shared memory cells $ML_0$–$ML_{31}$ and $MR_0$–$MR_{31}$.

Each of the memory cells includes two charge trapping regions, namely, a left charge trapping region and a right charge trapping region. The charge trapping regions of memory cell $M_{0,1}$ are labeled as left charge trapping region 1 and right charge trapping region 2. Similarly, the charge trapping regions of memory cell $M_{0,2}$ are labeled as left charge trapping region 3 and right charge trapping region 4.

The source and drain regions of memory cells $M_{0,0}$–$M_{31,6}$ are formed by diffused regions 101–108, which extend in parallel along the second axis. As described in more detail below, diffused regions 101–108 also operate as bit lines within memory block 100. Consequently, diffused regions 101–108 are hereinafter referred to as diffusion bit lines.

ONO structures 111–117 are located between adjacent diffusion bit lines 101–108. For example, ONO structure 111 is located between diffusion bit lines 101 and 102. The gates of the memory cells in each row are commonly connected to a word line. More specifically, the memory cells of rows 0–31 are connected to word lines $WL_0$–$WL_{31}$, respectively.

Figure 4A:
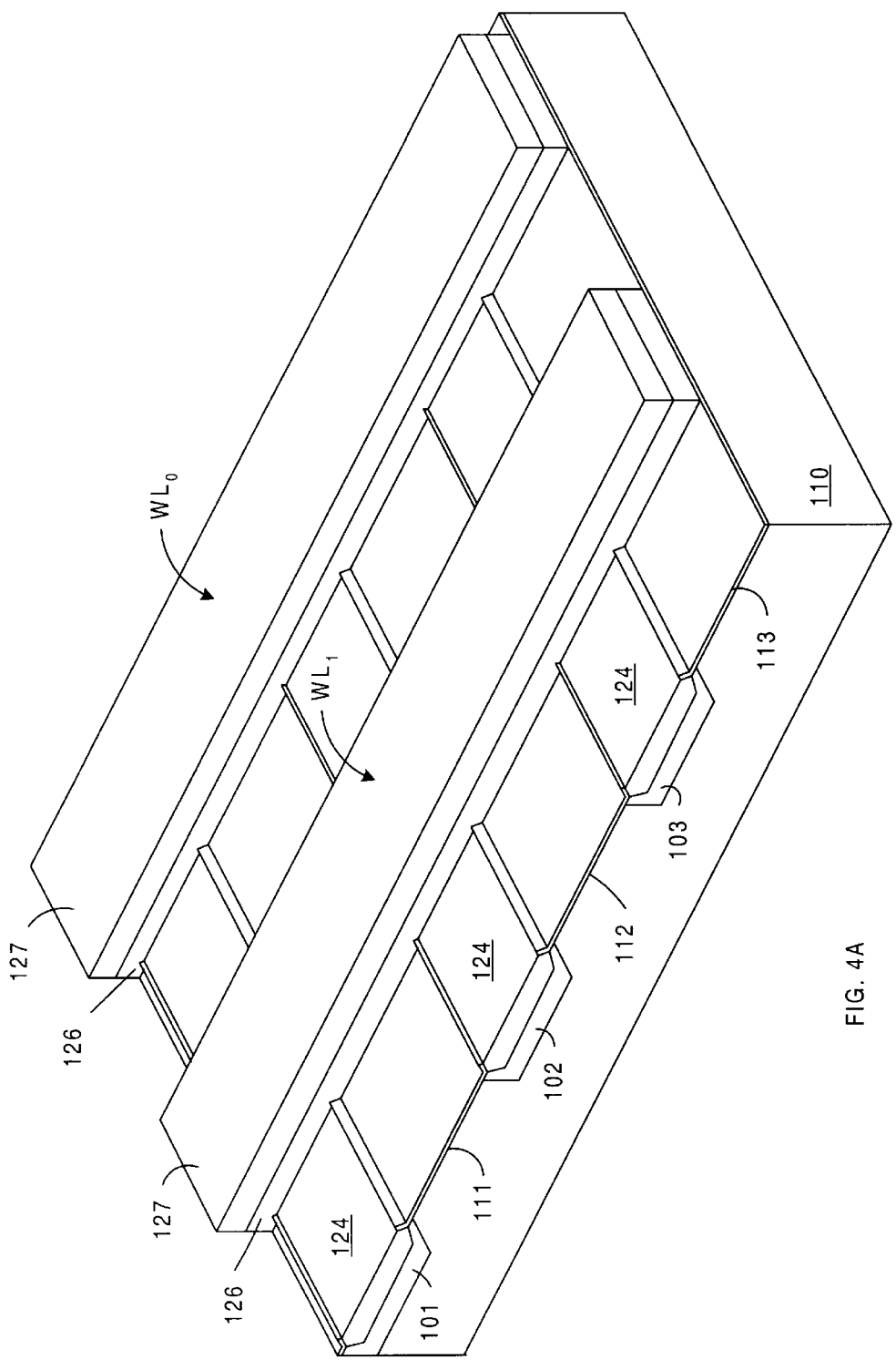
FIG. 4A is an isometric view of memory cells of the memory block of FIG. 3.
Figure 4B:
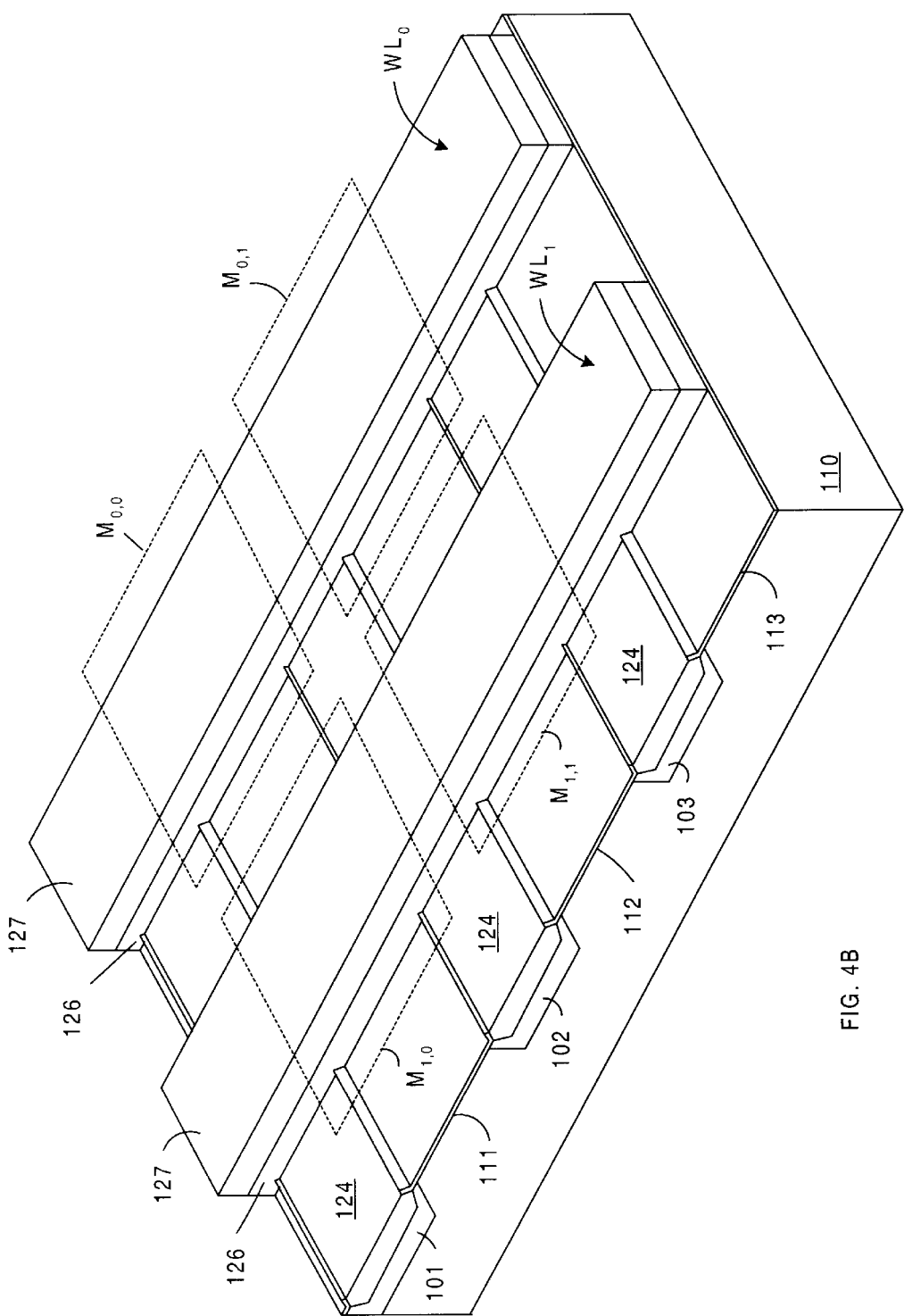
FIG. 4B illustrates the same isometric view as FIG. 4A, with the locations of the memory cells highlighted in dashed lines.
Figure 5:
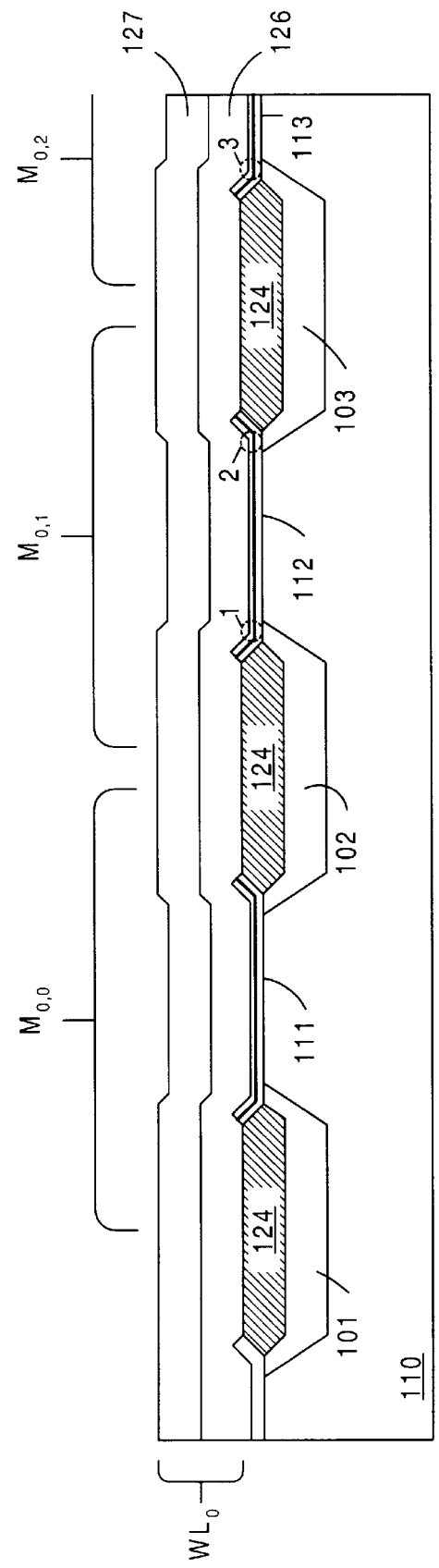
FIG. 5 is a cross sectional view of selected memory cells of FIG. 4A, taken along a word line.

FIG. 4A is an isometric view of memory cells $M_{0,0}$, $M_{0,1}$ $M_{1,0}$, and $M_{1,1}$. FIG. 4B illustrates the same isometric view as FIG. 4A, with the locations of memory cells $M_{0,0}$, $M_{0,1}$ $M_{1,0}$, and $M_{1,1}$ highlighted in dashed lines. FIG. 5 is a cross sectional view of memory cells $M_{0,0}$ and $M_{0,1}$ along the first axis through word line $WL_0$. Diffusion bit lines 101–103 are n-type regions formed in a p-type silicon semiconductor substrate 110. Diffusion bit lines 101–103 can also be formed in a p-well region. Bit line insulating regions 124 are formed over the diffusion bit lines 101–103. Bit line insulating regions 124 can be, for example, silicon oxide having a thickness of approximately 600 Å. Note that bit line insulating regions 124 are an order of magnitude thinner than conventional field oxide. Because the memory cells in memory block 100 do not require field oxide for isolation, memory block 100 can be referred to as a fieldless array. ONO structures 111 and 112 extend over bit line insulating regions 124, diffusion bit lines 101–103 and substrate 110 in the manner illustrated. Word lines $WL_0$ and $WL_1$, which are polycide or salicide structures that include a layer of conductively doped polycrystalline silicon 126 and an overlying layer of metal silicide 127, extend over ONO structures 111 and 112 (and bit line insulating regions 124). Word lines $WL_0$ and $WL_1$ form the control gates of memory cells $M_{0,0}$, $M_{0,1}$, $M_{1,0}$, and $M_{1,1}$. The above-described structures of memory block 100 are fabricated using flash processing steps. The fabrication of memory block 100 is described in more detail in commonly owned, co-filed U.S. patent application Ser. No. 09/244,316, entitled "METHODS FOR FABRICATING A SEMICONDUCTOR CHIP HAVING CMOS DEVICES AND A FIELDLESS ARRAY" by Efraim Aloni, which is hereby incorporated by reference.

Returning now to FIG. 3, the 2-bit memory cells of memory block 100 are accessed through high-voltage select transistors 131–138 and metal bit lines 141–144. Metal bit lines 141–144 are located in an interconnect layer that extends over the above-described elements of memory block 100. High-voltage select transistors 131–138 are designed to have gate oxide sufficient to withstand the high voltages required for programming and erasing the memory cells. In general, select transistors 131–138 are controlled to selectively connect metal bit lines 141–144 to diffusion bit lines 101–108. The first power terminals of select transistors 131–138 are coupled to diffusion bit lines 101–108, respectively. The second power terminals of select transistors 131 and 133 are coupled to metal bit line 141. The second power terminals of select transistors 132 and 134 are coupled to metal bit line 142. The second power terminals of select transistors 135 and 137 are coupled to metal bit line 143. The second power terminals of select transistors 136 and 138 are coupled to metal bit line 144. The gates of select transistors 131 and 135 are commonly connected to a first select line $S_1$, while the gates of select transistors 133 and 137 are commonly connected to a second select line $S_2$. Similarly, the gates of select transistors 132 and 136 are commonly connected to a third select line $S_3$, while the gates of select transistors 134 and 138 are commonly connected to a fourth select line $S_4$.

The memory cells in memory block 100 are accessed as follows. Two of the select lines $S_1$–$S_4$ are pulled high, thereby turning on the select transistors coupled to these two select lines, and two of the select lines $S_1$–$S_4$ are pulled low, thereby turning off the select transistors coupled to these two select lines. The turned on select transistors couple two columns of memory cells to the metal bit lines 141–144. During read operations, the logic high level of select lines $S_1$–$S_4$ is equal to the $V_{CC}$ supply voltage of about 3 Volts. However, during program and erase operations, the logic high level of select lines $S_1$–$S_4$ is equal to about 10 Volts. Providing this 10 Volt signal to select lines $S_1$–$S_4$ enables the select transistors to transmit relatively high program and erase voltages (e.g., 5.5 Volts and 8 Volts) to the appropriate bit lines.

For example, when select lines $S_2$ and $S_3$ are pulled high, and select lines $S_1$ and $S_4$ are pulled low, metal bit lines 141–142 are coupled to access the second column of memory cells, and metal bit lines 143–144 are coupled to access the seventh column of memory cells. More specifically, the logic high select lines $S_2$ and $S_3$ cause select transistors 132, 133, 136 and 137 to turn on, and the logic low select lines $S_1$ and $S_4$ cause select transistors 131, 134, 135 and 138 to turn off. Consequently, diffusion bit line 102 is coupled to metal bit line 142 and diffusion bit line 103 is coupled to metal bit line 141. Similarly, diffusion bit line 106 is coupled to metal bit line 144 and diffusion bit line 107 is coupled to metal bit line 143. As a result, signals provided on metal bit lines 141 and 142 are provided to control the memory cells in the second column of memory block 100, and signals provided on metal bit lines 143 and 144 are provided to control the memory cells in the seventh column of memory block 100.

A plurality of memory blocks, identical to memory block 100 can be coupled together along the first and second axes, thereby forming a larger memory array. Shared memory cells are formed at the interfaces between memory blocks along the first axis. More specifically, the right-most shared memory cells $MR_0$–$MR_{31}$ of one memory block combine with the left-most shared memory cells $ML_0$–$ML_{31}$ of an adjacent memory block to form another column of memory cells. Stated another way, the right-most diffusion bit line of one memory block combines with the left-most diffusion bit line of an adjacent memory block (along with the ONO layer located there between) to form a shared column of memory cells. This shared column of memory cells is accessed by the right-most metal line in a memory block and the left-most metal bit line in the right-adjacent memory block. This shared column of memory cells is accessed when select lines $S_1$ and $S_4$ are pulled high and select lines $S_2$ and $S_3$ are pulled low. Note that under these conditions, access is provided to the following memory cells in memory block 100: shared memory cells $ML_0$–$ML_{31}$, shared memory cells $MR_0$–$MR_{31}$ and the fourth column of memory cells $M_{0,3}$–$M_{31,3}$. Because each column of shared memory cells counts as a half column within memory block 100, there are effectively two accessed columns within memory block 100 under these conditions.

In accordance with one embodiment of the present invention, a memory array is formed by coupling 64 memory blocks identical to memory block 100 along the first axis. This memory array can have any number of memory blocks connected along the second axis. Because each memory block has four metal bit lines, the resulting memory array has a 256 metal bit lines associated with these 64 memory blocks. In this memory array, an additional diffusion bit line, metal bit line and select transistor must be added to the left side of each of the left-most memory blocks of the array. This enables the shared memory cells $ML_0$–$ML_{31}$ of the left-most memory blocks to be accessed. Similarly, an additional diffusion bit line, metal bit line, and select transistor must be added to the right side of each of the right-most memory blocks of the array, thereby enabling the shared memory cells $MR_0$–$MR_{31}$ of the right-most memory blocks to be accessed.

Figure 6:
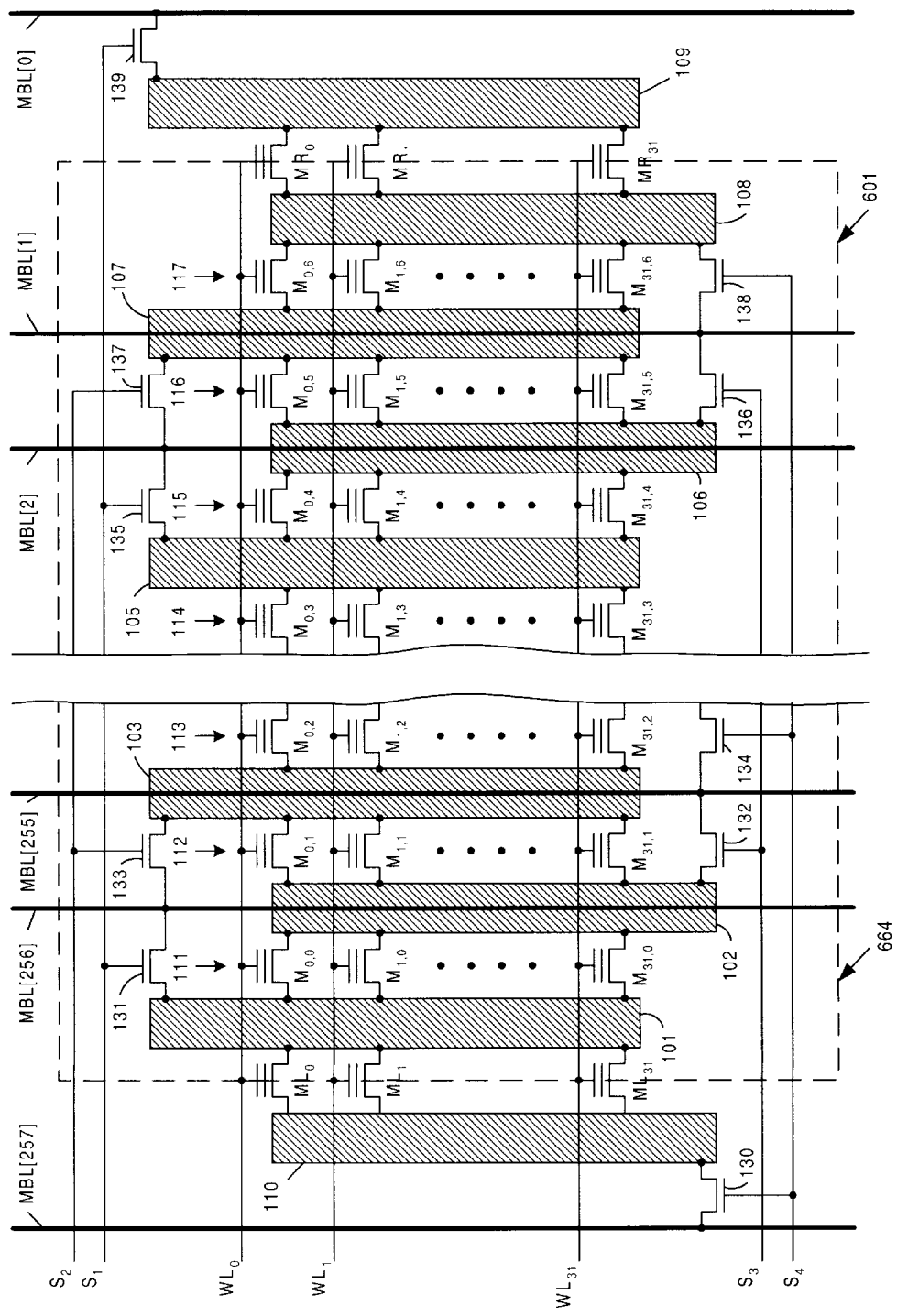
FIG. 6 is a schematic diagram illustrating additional diffusion bit lines, metal bit lines and select transistors connected at the left and right ends of a memory array in accordance with one embodiment of the present invention.

FIG. 6 is a schematic diagram illustrating the additional diffusion bit lines, metal bit lines and select transistors that are connected at the left and right edges of the memory array. In FIG. 6, only the left-most portion of a left-most memory block 664 and the right-most portion of a right-most memory block 601 are illustrated (i.e., memory blocks 602–663, which are located between memory blocks 601 and 664, are not illustrated). Because the left-most memory block 664 and the right-most memory block 601 are identical to memory block 100, the illustrated elements of memory blocks 664 and 601 are labeled with the same reference numbers as memory block 100. However, the metal bit lines are labeled as MBL[N] in FIG. 6, where N is an integer that identifies the metal bit line in the array. Thus, the right-most metal bit lines in memory block 601 are labeled MBL[2] and MBL[1]. Similarly, the left-most metal bit lines in memory block 664 are labeled as MBL[256] and MBL[255]. The 256 metal bit lines in the 64 memory blocks coupled along the first axis are therefore identified as metal bit lines MBL[256:1].

Diffusion bit line 110, metal bit line MBL[257] and select transistor 130 are located at the left edge of the array. Memory cells $ML_0$–$ML_{31}$ are formed between diffusion bit line 110 and diffusion bit line 101 of memory block 664. Select transistor 130 is connected between diffusion bit line 110 and metal bit line MBL[257]. The gate of select transistor 130 is coupled to select line $S_4$.

Similarly, diffusion bit line 109, metal bit line MBL[0] and select transistor 139 are located at the right edge of the array. Memory cells $MR_0$–$MR_{31}$ are formed between diffusion bit line 109 and diffusion bit line 108 of memory block 601. Select transistor 139 is connected between diffusion bit line 109 and metal bit line MBL[0]. The gate of select transistor 139 is coupled to select line $S_1$.

Because of the two additional metal bit lines MBL[257] and MBL[0] provided at the left and right edges of the memory array, the memory array has a total of 258 metal bit lines (i.e., MBL[257:0]).

For reasons that will become apparent, only one of the charge trapping regions in left-most memory cells $ML_0$–$ML_{31}$ is used to store data bits. In the described example, only the left charge trapping regions of left-most memory cells $ML_0$–$ML_{31}$ are used to store data bits. Similarly, only one of the charge trapping regions in right-most memory cells $MR_0$–$MR_{31}$ is used to store data bits. In the described example, only the right charge trapping regions of right-most memory cells $MR_0$–$MR_{31}$ are used to store data bits.

Access having been provided to all of the memory cells, program, read and erase operations are performed as follows.

Read Operation

A single bit of memory block 100 is read as follows. The word line associated with the selected memory cell is maintained at a nominal read voltage of 3 volts, while the word lines associated with the non-selected memory cells are held at a voltage of 0 Volts. It is understood that the read voltage of 3 Volts can change with respect to varying conditions. One of the diffusion bit lines of the selected memory cell is held at a voltage of 2 Volts, and the other diffusion bit line of the selected memory cell is coupled to a sense amplifier (and held at a voltage of about 0 Volts), such that a reverse read condition exists for the selected memory cell. For example, to read the right charge trapping region 2 of memory cell $M_{0,1}$, the word line $WL_0$ is held at a voltage of 3 Volts, while the word lines $WL_1$–$WL_{31}$ are held at 0 Volts. A voltage of 2 Volts is applied to diffusion bit line 102, and diffusion bit line 103 is coupled to a sense amplifier (and a voltage of about 0 Volts), thereby creating reverse read conditions for right charge trapping region 2 of memory cell $M_{0,1}$. Under these conditions, the non-selected memory cells are neither read nor disturbed.

Program Operation

For a programming operation, the word line associated with the selected memory cell is held at a programming voltage of 11 volts, while the word lines associated with the non-selected memory cells are held at a voltage of 0 Volts. The source region of the selected memory cell is maintained at a voltage of 0 Volts, and the drain region of the selected memory cell is maintained at a voltage of 5.5 Volts. For example, to program the right charge trapping region 2 of memory cell $M_{0,1}$, the word line $WL_0$ is held at a voltage of 11 Volts, while the word lines $WL_1$–$WL_{31}$ are held at 0 Volts. A voltage of 5.5 Volts is applied to diffusion bit line 103, and a voltage of 0 Volts is applied to diffusion bit line 102, thereby creating a program condition for right charge trapping region 2 of memory cell $M_{0,1}$. The duration of the programming operation is on the order of micro-seconds. Note that the duration of the programming operation is not long enough and the applied drain voltage of 5.5 Volts is not high enough to cause the non-selected memory cells to be erased during the programming operation.

Erase Operation

An erase operation is performed by applying 0 Volts to the gate of a selected memory cell and applying 8 Volts to the drain region of the selected memory cell. In general, erase operations in memory block 100 cannot be limited to a single memory cell. For example, an attempt to erase the right charge trapping region 2 of memory cell $M_{0,1}$ would proceed as follows. First, the select transistors 132 and 133 are turned on, thereby providing access to the second column of memory block 100 by coupling metal bit lines 141 and 142 to diffusion bit lines 103 and 102, respectively. An erase voltage of 8 Volts is applied to diffusion bit line 103, while the word line $WL_0$ is grounded.

Under these conditions, the right charge trapping region 2 of memory cell $M_{0,1}$ is erased. However, under these conditions, the left charge trapping region 3 of the adjacent memory cell $M_{0,2}$ is also erased. Moreover, if the non-selected word lines $WL_1$–$WL_{31}$ are maintained at 0 Volts, then the right charge trapping regions of all of the memory cells in the second column and the left charge trapping regions of all of the memory cells in the third column are also erased. As a result, the erase operation will erase a minimum of 64 bits. Raising the voltages on the non-selected word lines may eliminate the erase conditions, but may, in turn, create undesirable programming conditions.

To overcome these problems, the entire memory block 100 is erased at the same time. That is, memory block 100 is typically operated as a flash memory. To erase the entire memory block 100, all of the word lines $WL_0$–$WL_{31}$ are held at 0 Volts, and all of the diffusion bit lines 101–108 are held at a voltage of 8 Volts. In the embodiment described below, half of the diffusion bit lines are held at 8 Volts during a first portion of the erase operation, and the other half of the diffusion bit lines are held at 8 Volts during a second portion of the erase operation. The duration of the entire erase operation is on the order of milli-seconds. As described above, a normal erase operation in memory block 100 will erase at least 64 bits. However, to operate memory block 100 as an EEPROM, there must be a mechanism for erasing data on a word-by-word basis. Such mechanisms are described in commonly owned, co-filed U.S. patent application Ser. Nos. 09/244,529 and 09/244,317, entitled EEPROM ARRAY USING 2-BIT NON-VOLATILE MEMORY CELLS AND METHOD OF IMPLEMENTING SAME, by Yoav Lavi and Ishai Nachumovsky, and EEPROM ARRAY USING 2-BIT NON-VOLATILE MEMORY CELLS WITH SERIAL READ OPERATIONS by Ishai Nachumovsky.

Figure 7:
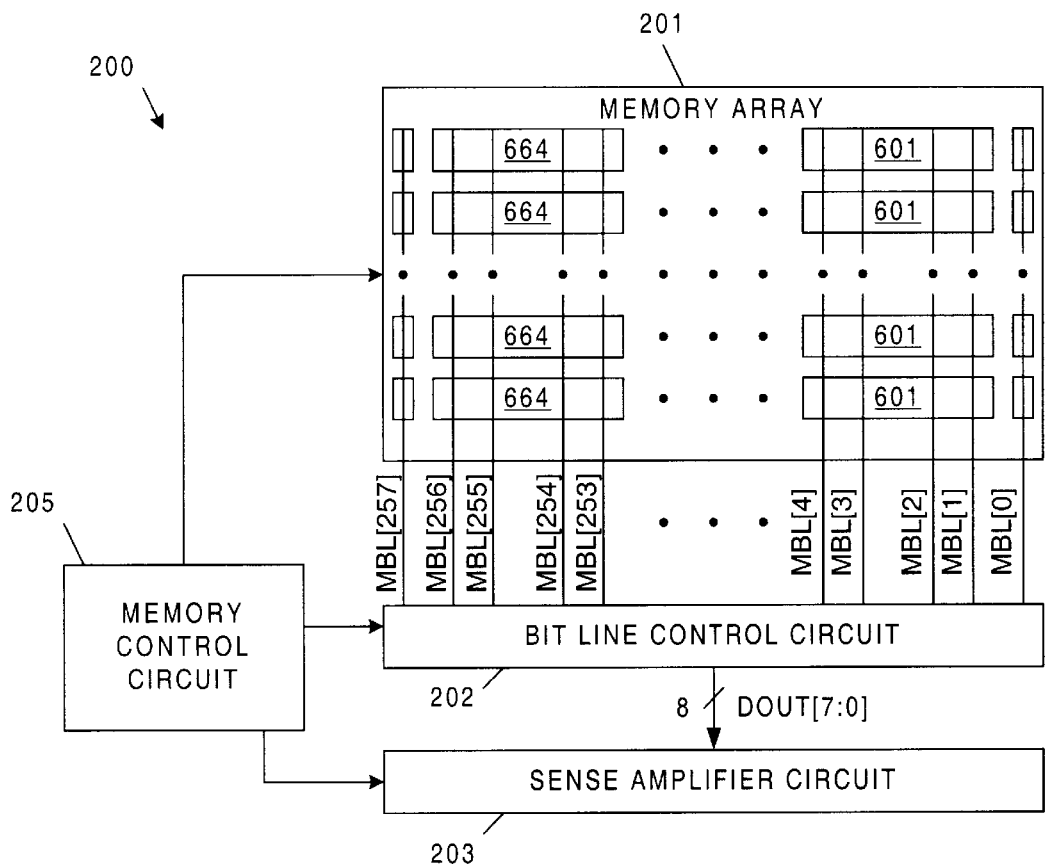
FIG. 7 is a block diagram of a memory system in accordance with one embodiment of the present invention.

FIG. 7 is a block diagram of a memory system 200 that performs read, program and erase operations in accordance with one embodiment of the invention. Memory system 200 includes memory array 201, bit line control circuit 202, sense amplifier circuit 203, and memory control circuit 205. In the described example, memory array 201 has a width of 64 memory blocks that are connected as described above in connection with FIG. 6. Thus, 258 metal bit lines MBL [257:0] are routed from memory array 201 to bit line control circuit 202. As described in more detail below, bit line control circuit 202 is controlled to apply the appropriate read, program and erase voltages to the metal bit lines MBL[257:0]. In the described embodiments, bit line control circuit 202 provides nominal voltages of 2 Volts, 5.5 Volts and 8 Volts for read, program and erase operations to the metal bit lines. However, it is understood that these voltages are not necessarily fixed and can vary with respect to varying conditions. During a read operation, bit line control circuit 202 also routes an addressed set of eight bit lines to sense amplifier circuit 203 in response to a column address received from memory control circuit 205.

The number of bit lines routed to sense amplifier circuit 203 is selected to correspond with the word width of memory array 201. In the described example, this word width is 8 bits.

The operation of erase emulation circuit 200 will now be described in connection with an example. This example describes the process required to erase one bit in a memory block within memory array 201. However, it is understood that this process is simultaneously performed for 8 bits in 8 different memory blocks, such that an entire word is erased. The present example assumes that it is desired to erase the bit stored in the right charge trapping region 2 of memory cell $M_{0,1}$ (FIG. 3).

First, memory control circuit 205 initiates a read operation within memory array 201 by asserting a 3 Volt signal on word line $WL_0$. Memory control circuit 205 also asserts the select signals on select lines $S_2$ and $S_3$, such that memory cell $M_{0,1}$ is coupled to metal bit lines 141 and 142. Memory control circuit 205 also causes bit line control circuit 202 to apply a read voltage of 2 Volts to metal bit line 142, and to couple metal bit line 141 to sense amplifier circuit 203 (where metal bit line 141 is coupled to ground), such that the bit stored in the right charge trapping region of memory cell $M_{0,1}$ is subjected to read conditions. Sense amplifier circuit 203 senses the state of the right charge trapping region of memory cell $M_{0,1}$ (along with the seven other addressed bits of the word). Sense amplifier circuit 203 routes the read word to storage device 204. Memory control circuit 205 causes the accessed bit (word) to be written to the first entry of storage device 204.

Memory control circuit 205 then sequentially performs read accesses of the right charge trapping regions of memory cells $M_{1,1}$–$M_{31,1}$. That is, memory control circuit 205 sequentially reads the bits from the right charge trapping regions of all of the memory cells in the second column. The bits read are stored in sequential locations in storage device 204.

Memory control circuit 205 then sequentially performs read accesses of the bits stored in the left charge trapping regions of memory cells $M_{0,2}$–$M_{31,2}$. That is, memory control circuit 205 causes the bits from the left charge trapping regions of all of the memory cells in the third column to be sequentially read. These bits are stored in sequential locations in storage device 204.

After these 64 read operations have been completed, all of the bits that would have been erased by erasing the right charge trapping region 2 of memory cell $M_{0,1}$ are stored in storage device 204. At this time, memory control circuit 205 performs an erase operation that erases the right charge trapping region 2 of memory cell $M_{0,1}$. As described above, this erase operation also erases the right charge trapping regions of memory cells $M_{1,1}$–$M_{31,1}$ and the left charge trapping regions of memory cells $M_{0,2}$–$M_{31,2}$.

After the erase operation has been completed, memory control circuit 205 performs 63 consecutive programming operations to restore the bits from storage device 204 to the right charge trapping regions of memory cells $M_{1,1}$–$M_{31,1}$ and the left charge trapping regions of memory cells $M_{0,2}$–$M_{31,2}$. That is, the bits are restored to the left charge trapping regions of all of the memory cells in the third column, and to the right charge trapping regions of all of the memory cells in the second column, except for the right charge trapping region of memory cell $M_{0,1}$. The net effect of these operations is to erase only the bit stored in the right charge trapping region of memory cell $M_{0,1}$. In the foregoing manner, memory array 201 can be erased on a word-by-word basis, thereby enabling memory array 201 to be operated as an EEPROM array. Note that a bit stored in the left charge trapping region of a memory cell can be erased in a similar manner.

The time required to read all 64 bits from memory array 201 is on the order of micro-seconds. The time required to perform the erase operation is on the order of tens of milli-seconds. The time required to re-program each of the 63 bits (words) back into memory array 201 is on the order of micro-seconds. Consequently, the time required to read and restore the 63 bits (words) that are not being erased is a small percentage (i.e., about 1 percent) of the total erase time.

In an alternative embodiment, the bit stored in the right charge trapping region of the memory cell to be erased (e.g., memory cell $M_{0,1}$) is not read from memory array 201 and stored in storage device 204. This step can be skipped because this bit is not restored to memory array 201.

It is understood that the endurance of memory array 201 may be limited in the present embodiment, because on average, the memory cells of memory array 201 will be erased and programmed approximately 63 times more often than memory cells in an equivalent flash memory. However, it is understood that this loss of endurance is acceptable in certain applications where memory array 201 is not expected to be re-programmed a large number of times.

Bit line control circuit 202 will now be described in more detail. As described above, the 2-bit memory cells used in array 201 can be programmed, read and erased in either one of two directions. To accomplish this, the program, read and erase voltages described above must be applied to each bit line pair in either one of the two directions. For example, assume that memory cell $M_{0,6}$ of memory block 601 (FIG. 6) is coupled to metal bit lines MBL[1] and MBL[2]. Table 1 defines the voltages that must be applied to metal bit lines MBL[1] and MBL[2] in order to perform read operations, program operations and erase operations for both the left and right charge trapping regions of memory cell $M_{0,6}$. The left and right charge trapping regions are abbreviated as LCTR and RCTR, respectively, in Table 1.

TABLE 1

| Operation of $M_{0,6}$ | Voltage of MBL[1] | Voltage of MBL[2] |
| --- | --- | --- |
| Program RCTR | 5.5 Volts | 0 Volts |
| Program LCTR | 0 Volts | 5.5 Volts |
| Read RCTR | 0 Volts | 2 Volts |
| Read LCTR | 2 Volts | About 0 Volts |
| Erase RCTR | 8 Volts | 0 Volts |
| Erase LCTR | 0 Volts | 8 Volts |

Bit line control circuit 202 must therefore provide many more voltage combinations than required by a conventional memory array.

Figure 8:
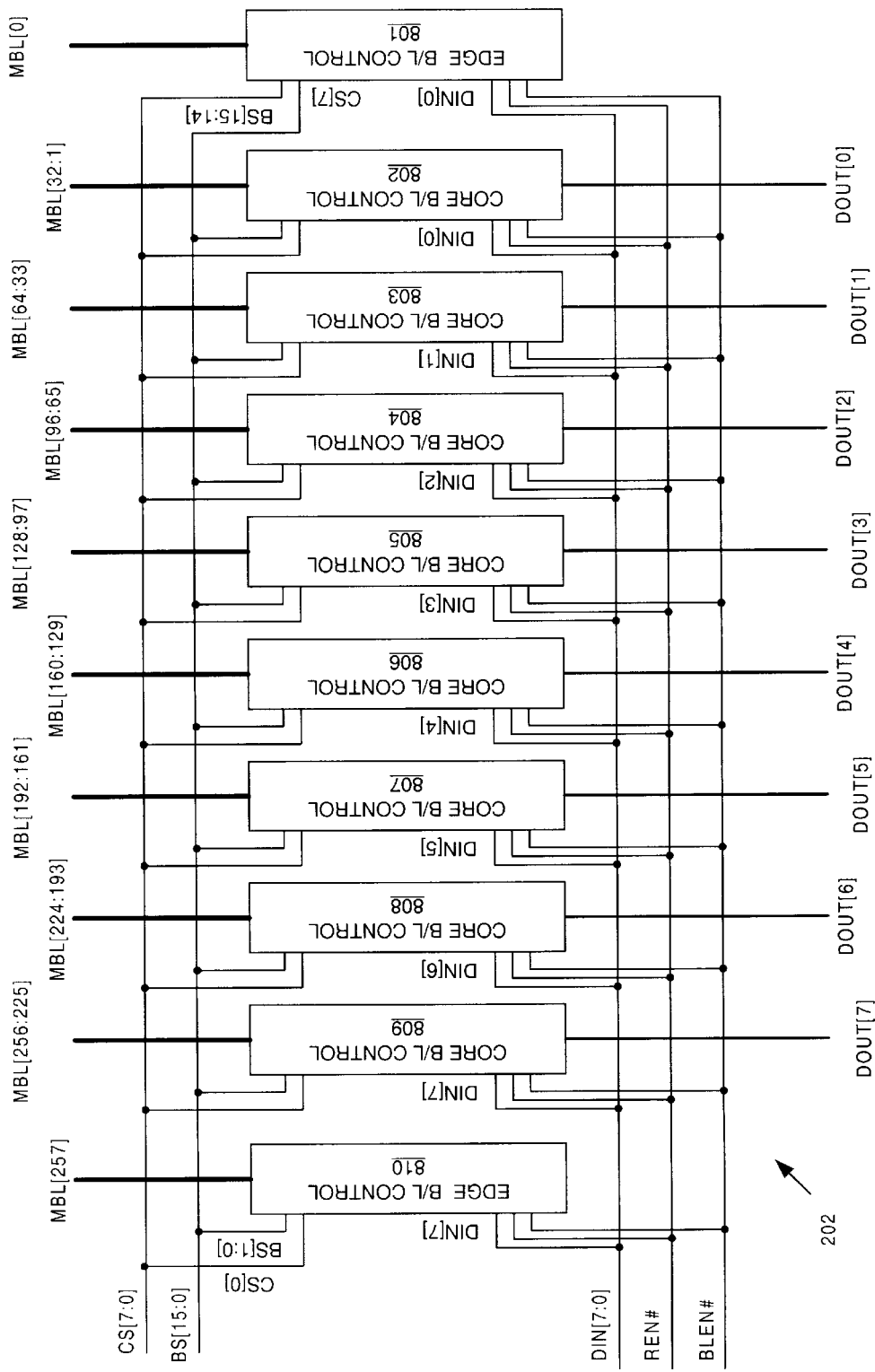
FIG. 8 is a block diagram of a bit line control circuit in accordance with one embodiment of the present invention.

FIG. 8 is a block diagram of bit line control circuit 202 in accordance with one embodiment of the present invention. Bit line control circuit 202 includes core bit line control circuits 802–809 and edge bit line control circuits 801 and 810. Each of core bit line control circuits 802–809 is coupled to receive 32 metal bit lines from memory array 201. Each of edge bit line control circuits 801 and 810 is coupled to receive an edge metal bit line from memory array 201. Table 2 identifies the metal bit lines received by bit line control circuits 801–810.

TABLE 2

| Bit Line Control Circuit | Metal Bit Lines |
| --- | --- |
| 801 | MBL[0] |
| 802 | MBL[32:1] |
| 803 | MBL[64:33] |
| 804 | MBL[96:65] |
| 805 | MBL[128:97] |
| 806 | MBL[160:129] |
| 807 | MBL[192:161] |
| 808 | MBL[224:193] |
| 809 | MBL[256:225] |
| 810 | MBL[257] |

Each of core bit line control circuits 802–809 is further coupled to receive column select signals CS[7:0], bit select signals BS[15:0], read enable signal REN#, and bit line enable signal BLEN# from memory controller 205. The symbol "#" indicates that the signal is active low. Core bit line control circuits 802–809 are also coupled to receive input data values DIN[0]–DIN[7], respectively, from memory controller 205 during programming and erase operations. Core bit line control circuits 802–809 provide output signals DOUT[0]–DOUT[7], respectively, to sense amplifier circuit 203 during read operations.

Right edge bit line control circuit 801 is coupled to receive column select signal CS[7], bit select signals BS[15:14], read enable signal REN#, bit line enable signal BLEN# and input data signal D[0] from memory controller 205. Similarly, left edge bit line control circuit 810 is coupled to receive column select signal CS[0], bit select signals BS[1:0], read enable signal REN#, bit line enable signal BLEN# and input data signal D[7] from memory controller 205.

Figure 9:
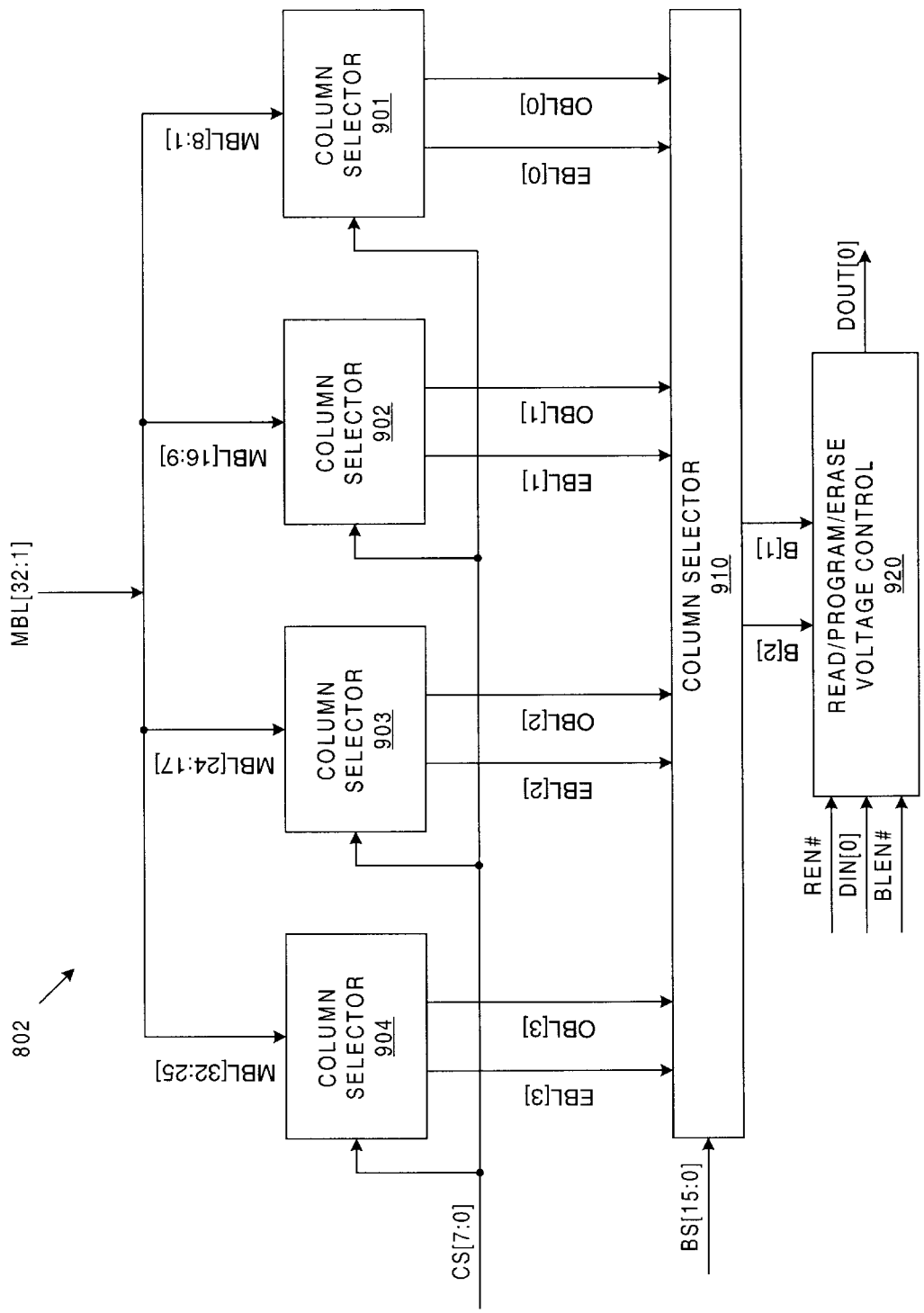
FIG. 9 is a block diagram of a core bit line control circuit located in the bit line control circuit of FIG. 8 in accordance with one embodiment of the present invention.

FIG. 9 is a block diagram of core bit line control circuit 802. Because all of core bit line control circuits 802–809 are identical, only core bit line control circuit 802 is described in detail. Core bit line control circuit 802 includes first-level column selector circuits 901–904 and second-level column selector circuit 910. Each of column selector circuits 901–904 is coupled to receive eight metal bit lines. More specifically, column selector circuits 901, 902, 903 and 904 are coupled to metal bit lines MBL[8:1], MBL[9:16], MBL[24:17] and MBL[32:25], respectively. Each of column selector circuits 901–904 is further coupled to receive column select signals CS[7:0].

Each of column selector circuits 901–904 couples a pair of the incoming metal bit lines to a pair of outgoing metal bit lines. For example, column selector circuit 901 couples a pair of the incoming metal bit lines MBL[8:1] to outgoing odd metal bit line OBL[0] and outgoing even metal bit line EBL[0]. In general, the notations OBL and EBL represent odd and even bit lines, respectively.

Figure 10:
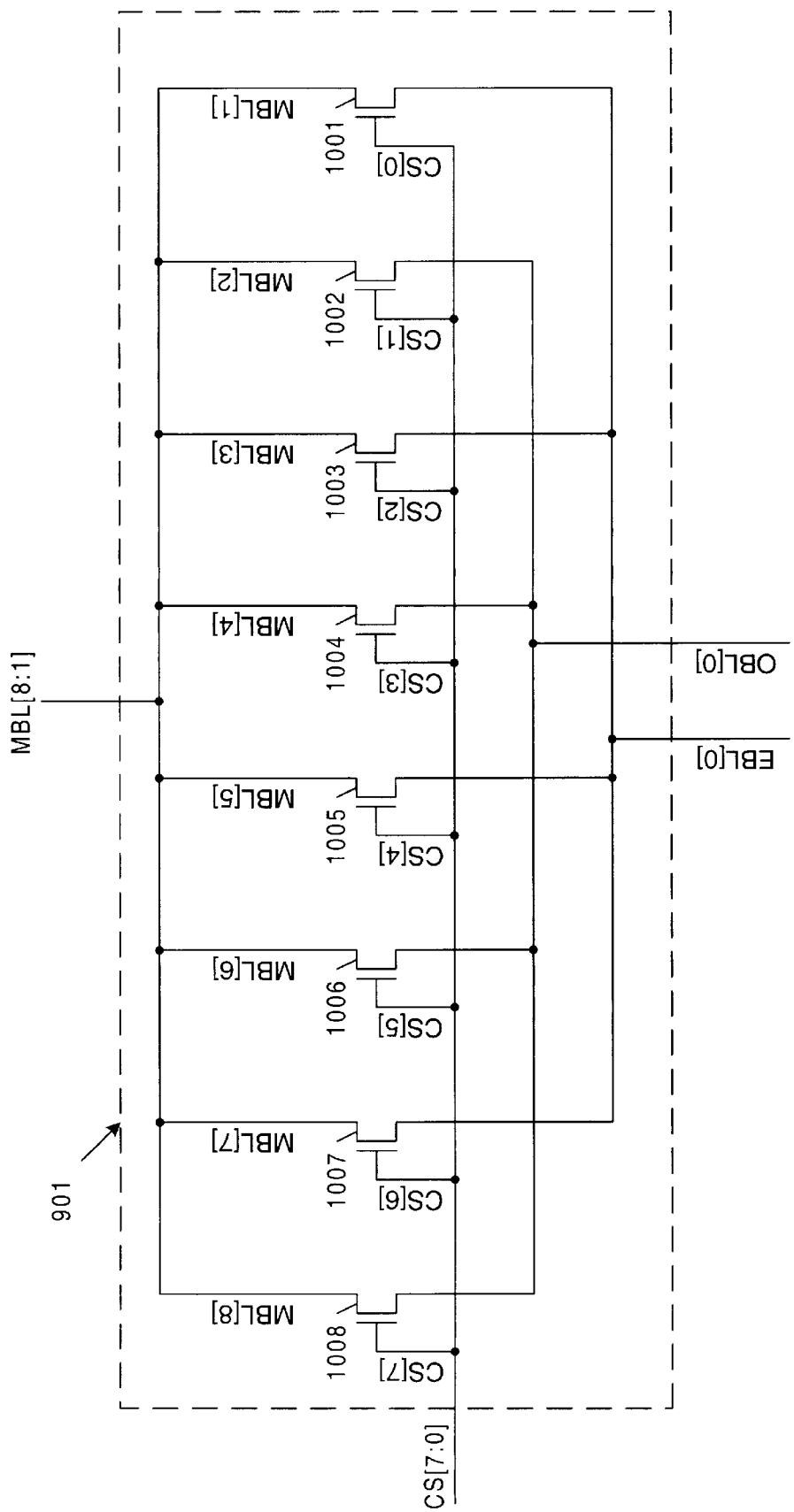
FIG. 10 is a schematic diagram of a first-level column selector circuit of the core bit line control circuit of FIG. 9 in accordance with one embodiment of the present invention.

FIG. 10 is a schematic diagram of first-level column selector circuit 901 in accordance with one embodiment of the present invention. In this embodiment, first-level column selector circuits 902–904 are identical to column selector circuit 901. Column selector circuit 901 includes n-channel pass transistors 1001–1008. The first power terminals of transistors 1001–1008 are coupled to metal bit lines MBL[1]–MBL[8], respectively. The second power terminals of transistors 1001, 1003, 1005 and 1007 are coupled to odd metal bit line OBL[0]. The second power terminals of transistors 1002, 1004, 1006, and 1008 are coupled to even metal bit line EBL[0]. Pass transistors 1001–1008 are controlled by column select signals CS[0]–CS[7], respectively. During read operations, the logic high level of column select signals CS[7:0] is equal to the $V_{CC}$ supply voltage of about 3 Volts. However, during program and erase operations, the logic high level of column select signals CS[7:0] is equal to about 10 Volts. Providing this 10 Volt signal enables pass transistors 1001–1008 to transmit relatively high program and erase voltages (e.g., 5.5 Volts and 8 Volts) to the appropriate metal bit lines.

Memory controller 205 asserts column select signals CS[7:0] in the following manner. Column select signals CS[7:0] are controlled such that: (1) two consecutive column select signals are asserted and all of the other column select signals are de-asserted, or (2) column select signals CS[7] and CS[0] are asserted and column select signals CS[6:1] are de-asserted. Table 3 summarizes the possible column select signals CS[7:0] and the metal bit lines that are coupled to EBL[0] and OBL[0] in response to these column select signals.

TABLE 3

| CS[7:0] | OBL[0] | EBL[0] |
| --- | --- | --- |
| 0000 0011 | MBL[1] | MBL[2] |
| 0000 0110 | MBL[3] | MBL[2] |
| 0000 1100 | MBL[3] | MBL[4] |
| 0001 1000 | MBL[5] | MBL[4] |
| 0011 0000 | MBL[5] | MBL[6] |
| 0110 0000 | MBL[7] | MBL[6] |
| 1100 0000 | MBL[7] | MBL[8] |
| 1000 0001 | MBL[1] | MBL[8] |

Thus, column selector circuit 901 selects two consecutive metal bit lines (or metal bit lines MBL[8] and MBL[1]) from metal bit lines MBL[8:1]. In general, first-level column selector circuits 901–904 reduce 32 incoming metal bit lines MBL[32:1] to 8 outgoing metal bit lines OBL[3:0] and EBL[3:0]. Because each of the core bit line control circuits 802–809 includes similar first-level column selector circuits, the 256 incoming metal bit lines MBL[256:1] provided to core bit line control circuits 802–809 are reduced to 64 outgoing metal bit lines OBL[31:0] and EBL[31:0] by the first-level column selector circuits.

Returning now to FIG. 9, the metal bit lines OBL[3:0] and EBL[3:0] are provided to second-level column selector circuit 910. Column selector circuit 910 receives bit select signals BS[15:0] from memory controller 205. Column selector circuit 910 routes two of the incoming metal bit lines OBL[3:0] and EBL[3:0] as outgoing metal bit lines B[2] and B[1] in response to the bit select signals BS[15:0].

Metal bit lines B[1] and B[2] are coupled to read/program/erase voltage control circuit 920. Voltage control circuit 920 is further coupled to receive read enable signal REN#, bit line enable signal BLEN# and input data signal DIN[0] from memory controller 205. Voltage control circuit 920 applies the appropriate voltages to metal bit lines B[1] and B[2] during read, program and erase operations. Voltage control circuit 920 also provides an output signal DOUT[0] to sense amplifier circuit 203 during a read operation.

Figure 11:
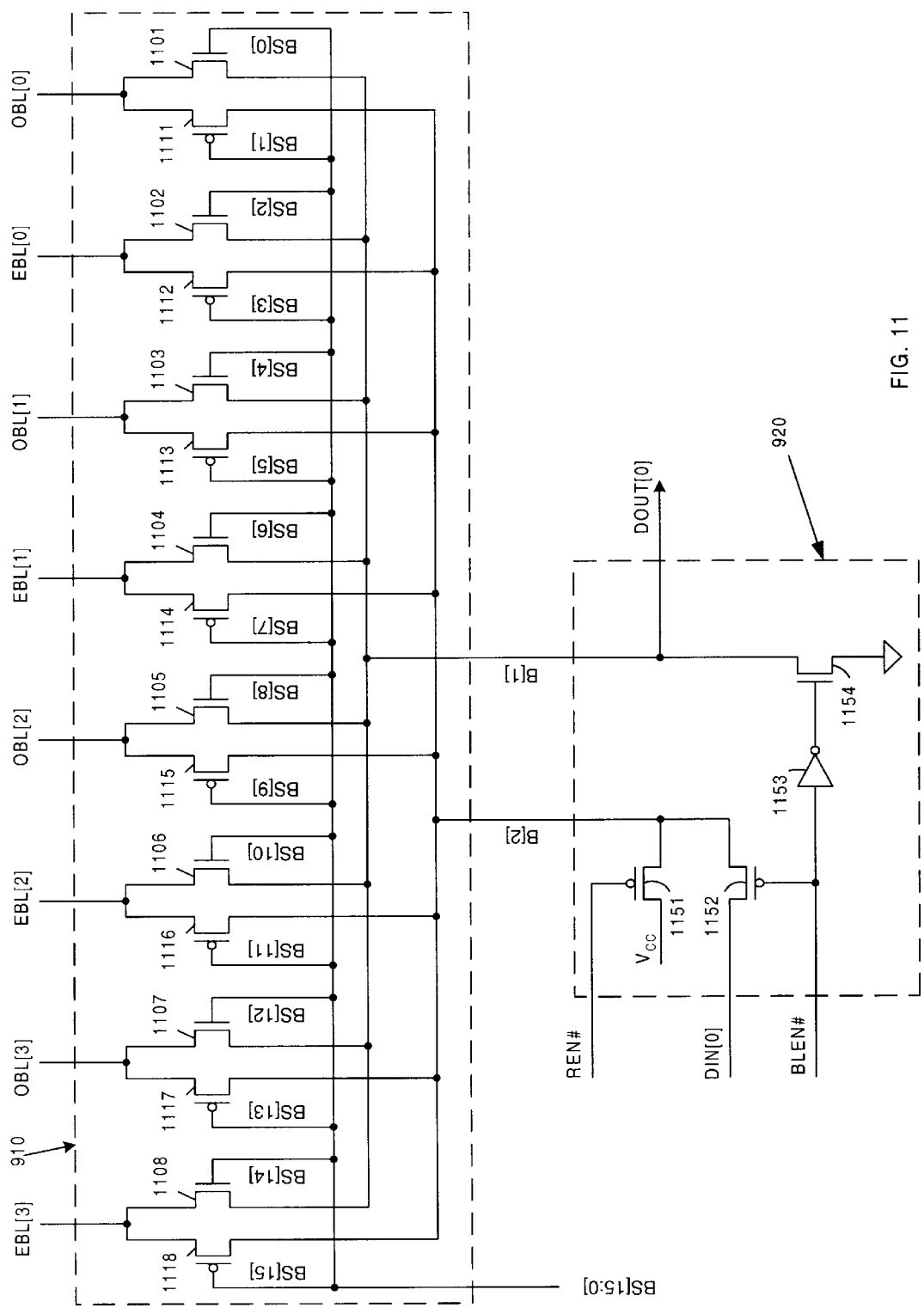
FIG. 11 is a schematic diagram of a second-level column selector circuit and a voltage control circuit of the core bit line control circuit of FIG. 9 in accordance with one embodiment of the present invention.

FIG. 11 is a schematic diagram of second-level column selector circuit 910 and voltage control circuit 920. Column selector circuit 910 includes n-channel pass transistors 1101–1108 and p-channel pass transistors 1111–1118, which are connected to metal bit lines OBL[3:0] and EBL[3:0] as illustrated. Each of transistors 1101–1108 and 1111–1118 is coupled to receive a corresponding one of the bit select signals BS[15:0]. As a result, each of the metal bit lines OBL[3:0] and EBL[3:0] can be selectively coupled to either bit line B[2] or B[1]. During read operations, the logic high level of bit select signals BS[15:0] is equal to the $V_{CC}$ supply voltage of about 3 Volts. However, during program and erase operations, the logic high level of bit select signals BS[15:0] is equal to about 10 Volts. Providing this 10 Volt signal enables n-channel pass transistors 1101–1108 to be turned on to transmit relatively high program and erase voltages (e.g., 5.5 Volts and 8 Volts) to the appropriate bit lines. Conversely, this 10 Volt signal enables p-channel pass transistors 1111–1118 to be turned off when desired. The bulk regions of the p-channel transistors in column selector circuit 910 and voltage control circuit 920 are coupled to the $V_{cc}$ supply voltage during read operations and to 10 Volts during program and erase operations.

Column selector circuit 910 advantageously allows a pair of bit lines to be coupled to metal bit lines B[2] and B[1] in a first configuration and in a second configuration that is reversed from the first configuration. For example, suppose that metal bit lines MBL[2] and MBL[1] from memory block 601 (FIG. 6) are routed to column selector circuit 910 as metal bit lines EBL[0] and OBL[0], respectively. By asserting BS[0] high and asserting BS[3] low (and de-asserting BS[2, 4, 6, 8, 10, 12, 14] low and de-asserting BS[1, 5, 7, 9, 11, 13, 15] high), metal bit line MBL[2] is coupled to metal bit line B[2], and metal bit line MBL[1] is coupled to metal bit line B[1]. However, these connections can be effectively reversed by asserting BS[2] high and asserting BS[1] low (and de-asserting BS[0, 4, 6, 8, 10, 12, 14] low and de-asserting BS[3, 5, 7, 9, 11, 13, 15] high). Under these conditions, metal bit line MBL[2] is coupled to metal bit line B[1], and metal bit line MBL[1] is coupled to metal bit line B[2].

At any given time, one of n-channel transistors 1101–1108 is turned on, thereby providing a connection to bit line B[1], and one of p-channel transistors 1111–1118 is turned on, thereby providing a connection to bit line B[2]. Table 4 summarizes the possible values for bit select signals BS[15:0] and the manner in which bit lines OBL[3:0] and EBL[3:0] are coupled to bit lines B[2] and B[1] under these conditions.

TABLE 4

| BS[15:0] | B[2] | B[1] |
|---|---|---|
| 10 10 10 10 10 10 00 11 | EBL[0] | OBL[0] |
| 10 10 10 10 10 10 11 00 | OBL[0] | EBL[0] |
| 10 10 10 10 10 00 11 10 | OBL[1] | EBL[0] |
| 10 10 10 10 10 11 00 10 | EBL[0] | OBL[1] |
| 10 10 10 10 00 11 10 10 | EBL[1] | OBL[1] |
| 10 10 10 10 11 00 10 10 | OBL[1] | EBL[1] |
| 10 10 10 00 11 10 10 10 | OBL[2] | EBL[1] |
| 10 10 10 11 00 10 10 10 | EBL[1] | OBL[2] |
| 10 10 00 11 10 10 10 10 | EBL[2] | OBL[2] |
| 10 10 11 00 10 10 10 10 | OBL[2] | EBL[2] |
| 10 00 11 10 10 10 10 10 | OBL[3] | EBL[2] |
| 10 11 00 10 10 10 10 10 | EBL[2] | OBL[3] |
| 00 11 10 10 10 10 10 10 | EBL[3] | OBL[3] |
| 11 00 10 10 10 10 10 10 | OBL[3] | EBL[3] |
| 11 10 10 10 10 10 10 00 | OBL[0] | EBL[3] |
| 00 10 10 10 10 10 10 11 | EBL[3] | OBL[0] |

As described in more detail below, the ability to reverse the configuration of the metal bit lines within second-level column selector circuit 910 facilitates the read, program and erase operations to both the right and left charge trapping regions of the memory cells in memory array 201. As also described in more detail below, the last two rows of Table 4 define the bit line configuration when the edge metal bit lines MBL[0] and MBL[257] are being used to access memory array 201.

Voltage control circuit 920 includes p-channel transistors 1151–1152, inverter 1153 and n-channel transistor 1154. Voltage control circuit 920 enables the read, program and erase voltages to be applied to metal bit lines B[2] and B[1].

The operation of voltage control circuit 920 during a read operation will now be described. During a read operation, memory control circuit 205 asserts the read enable signal REN# low, and de-asserts the bit line enable signal BLEN# signal high. P-channel transistor 1151 is coupled to provide a read voltage to bit line B[2] in response to the logic low read enable signal REN#. This read voltage is equal to the $V_{CC}$ supply voltage minus the drain-to-source voltage ($V_{ds}$) of the opened p-channel transistor 1151.

The logic high bit line enable signal BLEN# causes inverter 1153 to provide a logic low signal to the gate of n-channel transistor 1154. This turns off transistor 1154, thereby isolating bit line B[1] from ground. Under these conditions, metal bit line B[1] is coupled to sense amplifier circuit 203. Sense amplifier circuit 203 provide a voltage of about 0 Volts to metal bit line B[1], and then determines whether the resulting current flow is representative of a logic "0" or a logic "1" value. The voltage provided by sense amplifier circuit 203 is approximately 0.2 to 0.3 Volts. Thus, the voltage provided by sense amplifier circuit 203 approaches, but does not equal, 0 Volts. Sense amplifier circuit 203, which is a conventional circuit, stores the data value detected on bit line BL[1] as output data value DOUT[0].

The operation of voltage control circuit 920 during a program operation will now be described. During a program operation, memory control circuit 205 de-asserts the read enable signal REN# high, and asserts the bit line enable signal BLEN# signal low. P-channel transistor 1152 is coupled to provide a program voltage to bit line B[2] in response to the logic low bit line enable signal BLEN#. The program voltage is identified as input data value DIN[0]. Memory control circuit 205 selects the program voltage DIN[0] to be equal to 5.5 Volts if the memory cell coupled to metal bit lines B[1] and B[2] is to be programmed during the program operation. If the memory cell coupled to metal bit lines B[1] and B[2] is not to be programmed during the program operation, then memory control circuit 205 selects the program voltage DIN[0] to be 0 Volts. In the described embodiment, the 5.5 Volt program voltage is generated by a conventional charge pump circuit, or alternatively, by an external supply source.

The logic low bit line enable signal BLEN# causes inverter 1153 to provide a logic high signal to the gate of n-channel transistor 1154. This turns on transistor 1154, thereby connecting bit line B[1] to ground. As a result, bit line B[2] can be connected to a programming voltage of 5.5 Volts, and metal bit line B[1] is connected to voltage of 0 Volts. As described above, these are the desired source/drain programming voltages in accordance with the present embodiment.

An erase operation is performed in a manner similar to the program operation. During an erase operation, memory control circuit 205 de-asserts the read enable signal REN# high, and asserts the bit line enable signal BLEN# signal low. As a result, the input data value DIN[0] is provided to metal bit line B[2], and 0 Volts is applied to metal bit line B[1]. However, during an erase operation, memory control circuit 205 provides an input data value DIN[0] having a voltage of 8 Volts. As described above, these are the desired source/drain erase voltages in accordance with the present embodiment. In the described embodiment, the 8 Volt erase voltage is generated by a conventional charge pump circuit, or alternatively, by an external supply source.

Figure 12:
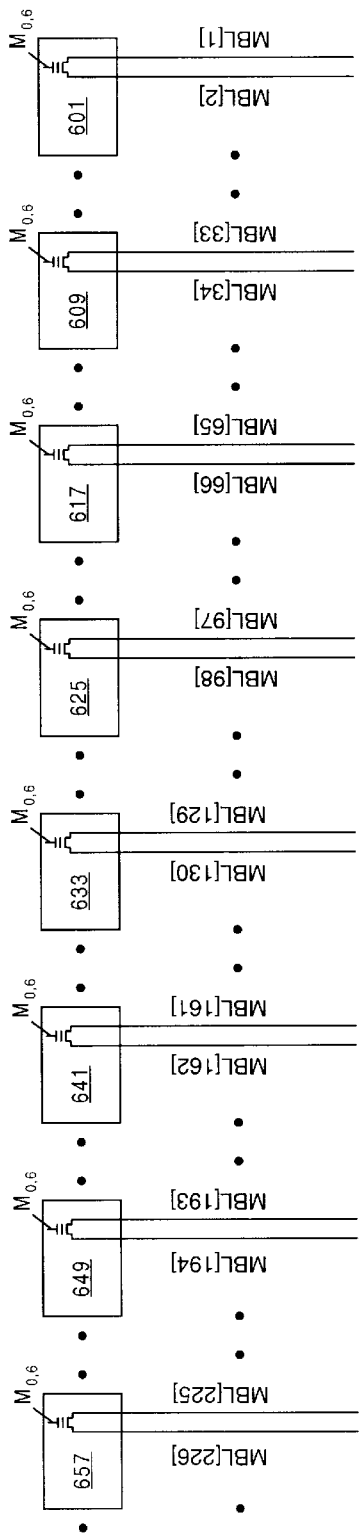
FIG. 12 is a block diagram illustrating the memory blocks storing a word and the bit lines used to access this word in accordance with one embodiment of the present invention.

The operation of bit line control circuit 202 will now be described in connection with a specific example. In this example, bit line control circuit 202 operates on a byte that resides in memory cell $M_{0,6}$ of memory blocks 601, 609, 617, 625, 633, 641, 649 and 657 of memory array 201. FIG. 12 is a block diagram illustrating the relevant portions of these memory blocks. The memory blocks are all identical to memory block 100, and are spaced apart by eight memory blocks along the first axis. The left charge trapping region of each memory cell $M_{0,6}$ in memory blocks 601, 609, 617, 625, 633, 641, 649 and 657 stores a bit of a first 8-bit word. Similarly, the right charge trapping region of each memory cell $M_{0,6}$ in memory blocks 601, 609, 617, 625, 633, 641, 649 and 657 stores a bit of a second 8-bit word. Bit line control circuit 202 accesses the memory cells $M_{0,6}$ in memory blocks 601, 609, 617, 625, 633, 641, 649 and 657 in parallel. For this reason, only the accessing of memory cell $M_{0,6}$ in memory block 601 is described in detail.

To access memory cell $M_{0,6}$, memory control circuit 205 asserts logic high signal on select lines $S_2$ and $S_4$ (FIG. 6), thereby turning on select transistors 137 and 138. At this time, the right charge trapping region of memory cell $M_{0,6}$ is coupled to metal bit line MBL[1], and the left charge trapping region of memory cell $M_{0,6}$ is coupled to metal bit line MBL[2].

Turning now to FIG. 10, memory control circuit 205 asserts the column select signals CS[0] and CS[1] high, thereby coupling the metal bit lines MBL[2] and MBL[1] to metal bit lines EBL[0] and OBL[0], respectively.

Turning now to FIG. 11, memory control circuit 205 controls the bit select signals BS[15:4] to turn off transistors 1103–1108 and 1113–1118. Memory control circuit 205 further controls bit select signals BS[3:0] in a manner that is consistent with the nature of the current transaction. For example, if the current transaction is: (1) a read access of the right charge trapping region of memory cell $M_{0,6}$, (2) a program access of the left charge trapping region of memory cell $M_{0,6}$, or (3) an erase access of the left charge trapping region of memory cell $M_{0,6}$, then memory control circuit 205 asserts the BS[0] and BS[3] signals, thereby coupling metal bit lines MBL[2] and MBL[1] to metal bit lines B[2] and B[1], respectively. This connection enables voltage control circuit 920 to appropriately provide: (1) a read voltage of 2 Volts to metal bit line B[2], (2) a program voltage of 5.5 Volts to metal bit line B[2], or (3) an erase voltage of 8 Volts to metal bit line B[2].

Conversely, if the current transaction is: (1) a read access of the left charge trapping region of memory cell $M_{0,6}$, (2) a program access of the right charge trapping region of memory cell $M_{0,6}$, or (3) an erase access of the right charge trapping region of memory cell $M_{0,6}$, then memory control circuit 205 asserts the BS[1] and BS[2] signals, thereby coupling metal bit lines MBL[2] and MBL[1] to metal bit lines B[1] and B[2], respectively. This connection enables voltage control circuit 920 to appropriately provide: (1) a read voltage of 2 Volts to metal bit line B[1], (2) a program voltage of 5.5 Volts to metal bit line B[1], or (3) an erase voltage of 8 Volts to metal bit line B[1].

In the foregoing manner, the same voltage control circuit 920 is advantageously used to access both the right and left charge trapping regions of memory cell $M_{0,6}$.

In the above-described example, all of the bits of the 8-bit word were present in centrally located memory blocks within memory array 201 (i.e., memory blocks 601, 609, 617, 625, 633, 641, 649 and 657). However, a special case exists when one of the bits of the 8-bit word is located in either the right-most column of memory cells $MR_0$–$M_{31}$ or in the left-most column of memory cells $ML_0$–$ML_{31}$ at the left and right edges of memory array 201 (FIG. 6).

Figure 13:
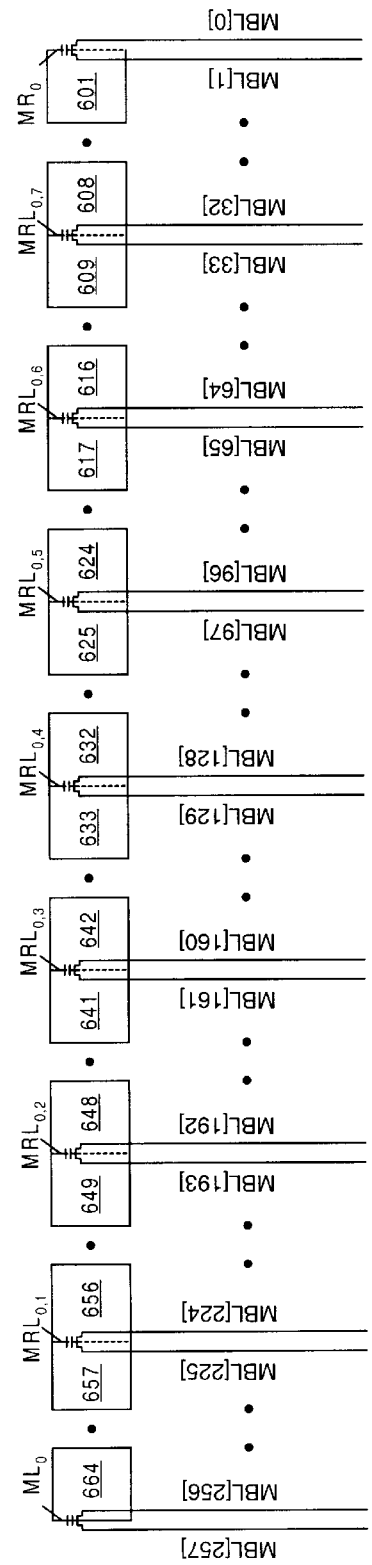
FIG. 13 is a block diagram illustrating the memory blocks storing a word and the bit lines used to access this word in accordance with another embodiment of the present invention.

FIG. 13 is a block diagram illustrating the metal bit lines that must be accessed in order to access the 8-bit words that have a bit located in either the right-most column of memory cells or the left-most column of memory cells in memory array 201. FIG. 13 illustrates memory cells in the first row (row 0) of memory blocks 601–664. The left-most memory cell in this row is memory cell $ML_0$, and the right-most memory cell in this row is memory cell $MR_0$ (FIG. 6). As described above, left-most memory cell $ML_0$ is accessed through metal bit lines MBL[257] and MBL[256], and right-most memory cell $MR_0$ is accessed through metal bit lines MBL[1] and MBL[0].

Seven other memory cells in the first row of memory array 201 are associated with memory cells $ML_0$ and $MR_0$. These centrally located memory cells are labeled as memory cells $MRL_{0,1}$ to $MRL_{0,7}$ because these memory cells are shared by right and left adjacent memory blocks. For example, memory cell $MRL_{0,7}$ is shared by memory blocks 608 and 609 (i.e., half of this memory cell is located in memory block 608 and half is located in memory block 609). Memory cell $MRL_{0,7}$ is coupled to metal bit lines MBL[33] and MBL[32]. Metal bit line MBL[33] is associated with memory block 609, and metal bit line MBL[32] is associated with memory block 608.

Note that there are nine pairs of bit lines coupled to memory cells in FIG. 13. These nine pairs of bit lines are used to provide two 8-bit words as follows. A first 8-bit word is provided on the eight left-most pairs of bit lines (i.e., MBL[257:256], MBL[225:224], MBL[193:192], MBL[161:160], MBL[129:128], MBL[97:96], MBL[65:64], and MBL[33:32]). This first 8-bit word is stored in the right charge trapping regions of the memory cells coupled to these bit line pairs.

A second 8-bit word is provided on the eight right-most pairs of bit lines (i.e., MBL[225:224], MBL[193:192], MBL[161:160], MBL[129:128], MBL[97:96], MBL[65:64], MBL[33:32] and MBL[1:0]). This second 8-bit word is stored in the left charge trapping regions of the memory cells coupled to these bit line pairs.

Thus, both the left and right charge trapping regions of the centrally located memory cells $MRL_{0,1}$ to $MRL_{0,7}$ are used to store data bits, but only one charge trapping region of the left-most memory cell $ML_0$ and one charge trapping region of the right-most memory cell $MR_0$ is used to store a data bit.

The following example describes the manner in which access is provided to the second 8-bit word, which is stored in the left charge trapping regions of memory cells $MRL_{0,1}$ to $MRL_{0,7}$ and right-most memory cell $MR_0$. More specifically, this example only describes the manner in which the right-most memory cell $MR_0$ and centrally located memory cell $MRL_{0,7}$ are accessed. The accessing of the other memory cells $MRL_{0,1}$ to $MRL_{0,6}$ will be apparent in view of the described example. The described example will also render obvious the manner of accessing of the first 8-bit word, which is stored in the right charge trapping regions of memory cells $MRL_{0,1}$ to $MRL_{0,7}$ and left-most memory cell $ML_0$.

To access memory cell $MR_0$, memory control circuit 205 asserts logic high signals on select lines $S_1$ and $S_4$ (FIG. 6), thereby turning on select transistors 138 and 139. At this time, the right charge trapping region of memory cell $MR_0$ is coupled to edge metal bit line MBL[0], and the left charge trapping region of memory cell $MR_0$ is coupled to metal bit line MBL[1]. Also at this time, the right charge trapping region of memory cell $MRL_{0,7}$ is coupled to metal bit line MBL[32], and the left charge trapping region of memory cell $MRL_{0,7}$ is coupled to metal bit line MBL[33]. Note that memory cells $MRL_{0,1}$ to $MRL_{0,6}$ and $ML_0$ are also coupled to their associated metal bit lines at this time.

Turning now to FIG. 10, memory control circuit 205 asserts the column select signals CS[0] and CS[7] high, thereby coupling the metal bit lines MBL[8] and MBL[1] to metal bit lines EBL[0] and OBL[0], respectively. (See, Table 3). The logic high CS[7] signal also causes metal bit line MBL[32] to be coupled to metal bit line EBL[3] in column select circuit 904. The logic high CS[0] signal causes metal bit line MBL[33] to be coupled to odd metal bit line OBL[4] within the associated column select circuit in core bit line control circuit 803.

Turning now to FIG. 11, memory control circuit 205 controls the bit select signals BS[13:2] to turn off transistors 1102–1107 and 1112–1117. Memory control circuit 205 further controls bit select signals BS[15:14] and BS[1:0] in a manner that is consistent with the nature of the current transaction. For example, if the current transaction is a read access, then memory control circuit 205 asserts the bit line select signals BS[15] and BS[0], thereby coupling metal bit lines MBL[32] and MBL[1] to metal bit lines B[2] and B[1], respectively. This connection enables voltage control circuit 920 to provide a read voltage of 2 Volts to metal bit line MBL[32], and a sense amplifier connection for metal bit line MBL[1]. In the foregoing manner, voltage control circuit 920 is effectively split to provide control voltages to bit lines in different bit line pairs.

Figure 14:
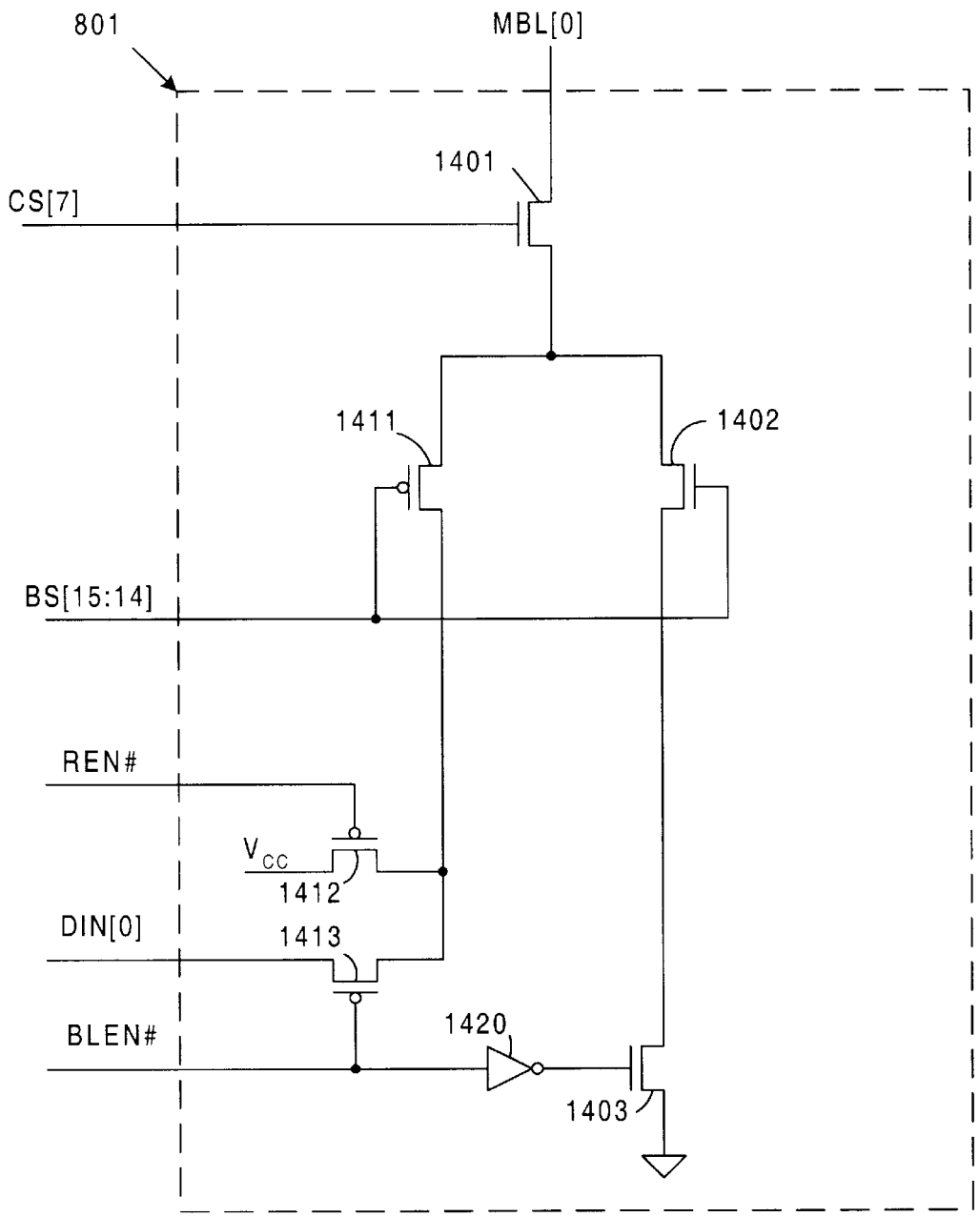
FIG. 14 is a schematic diagram of and edge bit line control circuit located in the bit line control circuit of FIG. 8 in accordance with one embodiment of the present invention.

Edge metal bit line MBL[0] is biased by edge bit line control circuit 801, which is described in more detail below. FIG. 14 is a schematic diagram of edge bit line control circuit 801. Edge bit line control circuit 801 includes n-channel transistors 1401–1403, p-channel transistors 1411–1413 and inverter 1420, which are connected as illustrated. Under the above-described conditions, n-channel transistor 1401 and p-channel transistors 1411–1412 are turned on, such that metal bit line MBL[0] is coupled to receive a read voltage of 2 Volts. Because metal bit line MBL[0] is coupled to a 2 Volt signal, and metal bit line MBL[0] is coupled to a sense amplifier, the left charge trapping region of memory cell $MR_0$ is subject to a read access.

Note that metal bit line MBL[33] is coupled to a corresponding sense amplifier by the voltage control circuit present in bit line control circuit 803. Because metal bit line MBL[32] is coupled to a 2 Volt signal, and metal bit line MBL[33] is coupled to a sense amplifier, the left charge trapping region of memory cell $MRL_{0,7}$ is subject to a read access. The left charge trapping regions of the six other memory cells $MRL_{0,1}$ to $MRL_{0,6}$ of the first word are simultaneously accessed in the same manner.

If the current transaction is a programming access, then the control signals are asserted as follows. The column select signals CS[7] and CS[0] are asserted, thereby routing the metal bit lines through the first-level column selector in the manner described above. However, for the programming operation, the bit select signals BS[14] and BS[1] are asserted. This effectively switches the bit line connections within the second-level column selector, such that metal bit line MBL[32] is coupled to metal bit line B[1], and metal bit line MBL[1] is coupled to bit line B[2].

During the programming operation, the bit line enable signal BLEN# is asserted low. As a result, voltage control circuit 920 applies programming voltage DIN[0] to metal bit line MBL[1], and grounds metal bit line MBL[32]. Within edge bit line control circuit 801 (FIG. 14), edge metal bit line MBL[0] is grounded through turned on n-channel transistors 1401, 1402 and 1403. Because metal bit line MBL[1] is held at a programming voltage, and edge metal bit line MBL[0] is grounded, The left charge trapping region of memory cell $MR_0$ is subject to a programming access. The left charge trapping regions of memory cells $MRL_{0,1}$–$MRL_{0,7}$ are also subject to a programming access at this time.

If the current transaction is an erase transaction, the memory cells of the first word are accessed in the same manner as described above for the programming transaction. However, the programming voltage (e.g., 5.5 Volts) is replaced with an erase voltage (e.g., 8 Volts), and the word line is controlled to have the appropriate value (e.g., 0 Volts).

The second word, which is stored in the right charge trapping regions of memory cells $ML_0$ and $MRL_{0,1}$–$MRL_{0,7}$, is accessed in a similar manner. However, when accessing the second word, edge bit line control circuit 810 is used to access left-most memory cell $ML_0$. Edge bit line control circuit 810 is identical to above-described edge bit line control circuit 801. However, edge bit line control circuit 810 operates in response to a different set of control signals as defined by FIG. 8.

Although the invention has been described in connection with several embodiments, it is understood that this invention is not limited to the embodiments disclosed, but is capable of various modifications which would be apparent to a person skilled in the art. For example, although the memory blocks have been described as having eight diffusion bit lines, four metal bit lines and eight select transistors, it is understood that memory blocks having different numbers of diffusion bit lines, metal bit lines and select transistors can be constructed. Moreover, although memory blocks 100 and 300 have been described as having 32 rows of memory cells and one row of memory cells, respectively, it is understood that other numbers of memory cell rows can be used in other embodiments. Although the invention has been described in connection with words having a length of 8-bits, other word lengths can be used in other embodiments (e.g., 4-bits, 16-bits or 32-bits). In addition, it is understood that the various described p-type regions can be interchanged with the described n-type regions to provide similar results. Thus, the invention is limited only by the following claims.

What is claimed is:

1. A bit line control circuit comprising:
    a plurality of first-level pass transistors coupled to receive a first set of bit lines from a memory array, wherein each bit line in the first set of bit lines is coupled to one and only one of the first-level pass transistors;
    a second set of bit lines coupled to the first-level pass transistors;
    a plurality of second-level pass transistors coupled to the second set of bit lines, wherein each bit line in the second set of bit lines is coupled to a parallel-connected pair of the second level pass transistors;
    a third set of bit lines coupled to the second-level pass transistors; and
    a plurality of voltage control circuits coupled to the third set of bit lines, wherein the voltage control circuits apply voltages to the third set of bit lines to perform read, write and erase operations in the memory array.

2. The bit line control circuit of claim 1, wherein the first set of bit lines comprise $2^N+2$ bit lines, wherein N is a whole number.

3. The bit line control circuit of claim 2, wherein the first set of bit lines comprise $2^N$ centrally located bit lines and 2 edge bit lines.

4. The bit line control circuit of claim 2, wherein the bit line control circuit accesses words having a length of $2^{N-4}$ bits.

5. The bit line control circuit of claim 1, wherein the first set of bit lines comprise $2^N+2$ bit lines and the second set of bit lines comprise $2^{N-2}+2$ bit lines, wherein N is a whole number greater than or equal to two.

6. The bit line control circuit of claim 1, wherein the first set of bit lines comprise $2^N+2$ bit lines and the third set of bit lines comprise $2^{N-4}+4$ bit lines, wherein N is a whole number greater than or equal to four.

7. The bit line control circuit of claim 1, wherein each of the voltage control circuits is coupled to two bit lines in the third set of bit lines.

8. The bit line control circuit of claim 1, wherein a plurality of the first-level pass transistors are grouped to form a plurality of first-level multiplexers, each of the first-level multiplexers receiving a consecutive group of bit lines in the first set of bit lines.

9. The bit line control circuit of claim 8, wherein the first set of bit lines comprise a first edge bit line and a second edge bit line, wherein the first-level pass transistor coupled to the first edge bit line forms a first edge multiplexer, and the first-level pass transistor coupled to the second edge bit line forms a second edge multiplexer.

10. The bit line control circuit of claim 9, wherein each of the first-level multiplexers, the first edge multiplexer and the second edge multiplexer are each coupled to a pair of bit lines in the second set of bit lines.

11. The bit line control circuit of claim 1, wherein a plurality of the second-level pass transistors are grouped to form a plurality of second-level multiplexers, each of the second-level multiplexers receiving a consecutive group of bit lines in the second set of bit lines.

12. The bit line control circuit of claim 1, wherein the memory array comprises an array of non-volatile memory cells.

13. The bit line control circuit of claim 12, wherein the non-volatile memory cells are 2-bit non-volatile memory cells.

14. The bit line control circuit of claim 1, further comprising a memory control circuit coupled to control the first-level pass transistors, the second level pass transistors and the voltage control circuits.

15. The bit line control circuit of claim 1, wherein the first-level pass transistors and the second-level pass transistors provide the voltage control circuits with access to any consecutive pair of bit lines in the first set of bit lines in both a first configuration and a second configuration.

16. A method of controlling a first set of bit lines received from a memory array, the method comprising the steps of:
    coupling each bit line in the first set of bit lines to a single corresponding first-level pass transistor;
    controlling the first-level pass transistors to selectively couple a subset of the first set of bit lines to a second set of bit lines;
    coupling each bit line in the second set of bit lines to a parallel-connected pair of second-level pass transistors;
    controlling the second-level pass transistors to selectively couple a subset of the second set of bit lines to a third set of bit lines in a first order; and
    controlling the second-level pass transistors to selectively couple the subset of the second set of bit lines to the third set of bit lines in a second order, which is reversed from the first order.

17. A method of accessing a 2-bit non-volatile memory cell having a first charge trapping region and a second charge trapping region, the method comprising the steps of:
    coupling the memory cell to a pair of bit lines;
    routing the pair of bit lines through a multiplexer circuit to a voltage control circuit in a first order; and
    routing the pair of bit lines through the multiplexer circuit to the voltage control circuit in a second order which is reversed from the first order.

18. The method of claim 17, wherein the method further comprises the steps of:
    erasing and programming the first charge trapping region, and reading the second charge trapping region when the pair of bit lines is routed through the multiplexer circuit to the voltage control circuit in the first order; and
    erasing and programming the second charge trapping region, and reading the first charge trapping region when the pair of bit lines is routed through the multiplexer circuit to the voltage control circuit in the second order.

* * * * *